(12) United States Patent
Saneyoshi et al.

(10) Patent No.: US 10,401,403 B2
(45) Date of Patent: Sep. 3, 2019

(54) MONITORING DEVICE, MONITORING SYSTEM, MONITORING METHOD, AND NON-TRANSITORY STORAGE MEDIUM

(71) Applicant: NEC Corporation, Tokyo (JP)

(72) Inventors: Eisuke Saneyoshi, Tokyo (JP); Koji Kudo, Tokyo (JP); Ryo Hashimoto, Tokyo (JP); Kosuke Homma, Tokyo (JP); Takahiro Toizumi, Tokyo (JP)

(73) Assignee: NEC Corporation, Tokyo (JP)

( * ) Notice: Subject to any disclaimer, the term of this patent is extended or adjusted under 35 U.S.C. 154(b) by 11 days.

(21) Appl. No.: 15/300,512

(22) PCT Filed: Jan. 23, 2015

(86) PCT No.: PCT/JP2015/051788
§ 371 (c)(1),
(2) Date: Sep. 29, 2016

(87) PCT Pub. No.: WO2015/151558
PCT Pub. Date: Oct. 8, 2015

(65) Prior Publication Data
US 2017/0176503 A1    Jun. 22, 2017

(30) Foreign Application Priority Data
Mar. 31, 2014  (JP) .................................. 2014-071122

(51) Int. Cl.
*G01R 21/133*   (2006.01)
*G01R 21/06*    (2006.01)

(52) U.S. Cl.
CPC ........... *G01R 21/133* (2013.01); *G01R 21/06* (2013.01)

(58) Field of Classification Search
CPC .................. G01R 31/2894; G01R 31/2853
(Continued)

(56) References Cited

U.S. PATENT DOCUMENTS

| 8,233,974 B2 * | 7/2012 | Ward ................ A61B 5/0537 600/547 |
| 2007/0212036 A1 * | 9/2007 | Halsall ................ F24H 1/202 392/451 |

(Continued)

FOREIGN PATENT DOCUMENTS

| JP | 2003-9430 | 1/2003 |
| JP | 3403368 | 5/2003 |

(Continued)

OTHER PUBLICATIONS

International Search Report and Written Opinion dated Apr. 28, 2015, in corresponding PCT International Application.

*Primary Examiner* — Giovanni Astacio-Oquendo
(74) *Attorney, Agent, or Firm* — Finnegan, Henderson, Farabow, Garrett & Dunner, L.L.P.

(57) ABSTRACT

A monitoring device (10) includes a unit-specific waveform data acquisition unit (11) that acquires waveform data in a unit in which electrical devices are installed; a first inference unit (13) that infers change in operation states of at least some of the electrical devices based on a first monitoring difference group including at least one of at least one kind of feature amount extracted from waveform data of a difference between waveform data of a first timing and waveform data of a second timing in the waveform data, and a differences of at least one kind of feature amounts extracted from the waveform data of the first timing and the waveform data of the second timing, and training difference information regarding a difference between a first operation state and a second operation state of each of the electrical devices; and a second inference unit (14) that infers an operation state of each of the electrical devices based on an inference result of the first inference unit (13).

13 Claims, 26 Drawing Sheets

(58) Field of Classification Search
USPC .......................... 324/113, 71.11, 73.1, 76.11
See application file for complete search history.

(56) References Cited

U.S. PATENT DOCUMENTS

| | | | | |
|---|---|---|---|---|
| 2008/0303138 A1* | 12/2008 | Flett | ...................... | H01L 23/473 257/714 |
| 2014/0263280 A1* | 9/2014 | Ramacciotti | ............ | F24H 3/002 219/528 |
| 2015/0059780 A1* | 3/2015 | Davis | .................... | A24F 47/008 131/328 |
| 2015/0145524 A1* | 5/2015 | Duncan | ................ | G01R 31/024 324/538 |
| 2016/0054370 A1* | 2/2016 | Fomin | .................. | G01R 31/025 324/509 |
| 2016/0178689 A1* | 6/2016 | Okita | ................... | G01R 31/024 324/509 |

FOREIGN PATENT DOCUMENTS

| | | |
|---|---|---|
| JP | 2006-353005 | 12/2006 |
| JP | 4433890 | 3/2010 |
| JP | 2010-169567 | 8/2010 |
| JP | 4565511 | 10/2010 |
| JP | 2011-232061 | 11/2011 |
| JP | 2013-9500 | 1/2013 |

\* cited by examiner

FIG. 3

| TRAINING DATA ID | DEVICE ID | FIRST OPERATION STATE | SECOND OPERATION STATE | TRAINING FEATURE AMOUNT |
|---|---|---|---|---|
| 0001-003 | 0001 | 5w | 10w | ... |
| 0001-004 | 0001 | 5w | 15w | ... |
| ... | ... | ... | ... | ... |

FIG. 5

| TRAINING DATA ID | SUM TRAINING FEATURE AMOUNT | STATE |
|---|---|---|
| (0001—003)+(0002—003) | .... | (0001) IS CHANGED 5w→10w<br><br>(0002) IS CHANGED 10w→50w |
| ⋮ | ⋮ | ⋮ |

FIG. 8

| DEVICE ID | STATE |
|-----------|-------|
| 0001 | 0w |
| 0002 | 150w |
| ⋮ | ⋮ |

FIG. 9

| DEVICE ID | TRAINING DATA ID | POWER VALUE BAND | REPRE-SENTATIVE VALUE | TRAINING FEATURE AMOUNT | STATE |
|---|---|---|---|---|---|
| 0001 | D 1(2.5) | GREATER THAN 0 W AND EQUAL TO OR LESS THAN 5 W | 2.5w | ○○○ | DRYER IS CONSUMING 2.5 W |
| 0001 | D 2(7.5) | GREATER THAN 5 W AND EQUAL TO OR LESS THAN 10 W | 7.5w | ×××  | DRYER IS CONSUMING 7.5 W |
| ... | ... | ... | ... | ... | ... |
| 0001 | D 240(1197.5) | GREATER THAN 1195 W AND EQUAL TO OR LESS THAN 1200 W | 1197.5w | △△△ | DRYER IS CONSUMING 1197.5 W |

FIG. 10

| TRAINING DATA ID | POWER VALUE BAND | REPRESENTATIVE VALUE | TRAINING FEATURE AMOUNT | STATE |
|---|---|---|---|---|
| D 1 | EQUAL TO OR GREATER THAN 610 W AND EQUAL TO OR LESS THAN 615 W | 612.5w | ○×○ | DRYER IS CONSUMING 612.5 W |
| D 2 | EQUAL TO OR GREATER THAN 733 W AND EQUAL TO OR LESS THAN 738 W | 735.5w | □□× | DRYER IS CONSUMING 735.5 W |
| .... | .... | .... | .... | .... |
| D n | EQUAL TO OR GREATER THAN 1107 W AND EQUAL TO OR LESS THAN 1112 W | 1109.5w | ○×× | DRYER IS CONSUMING 1109.5 W |

FIG. 17

| TOTAL POWER CONSUMPTION | 2500w |
| AIR-CONDITIONER | 1000w |
| DRYER | 900w |
| REFRIGERATOR | 200w |
| ⋮ | |
| | HH:MI DD/MM/20YY |

FIG. 18

| TRAINING DATA ID | DEVICE ID | FIRST OPERATION STATE | SECOND OPERATION STATE | TRAINING FEATURE AMOUNT |
|---|---|---|---|---|
| 0001-001 | 0001 | POWER OFF | POWER ON | ... |
| 0001-002 | 0001 | POWER ON | POWER OFF | ... |
| 0002-001 | 0002 | POWER OFF | POWER ON | ... |
| ... | ... | ... | ... | ... |

FIG. 19

| TRAINING DATA ID | SUM TRAINING FEATURE AMOUNT | STATE |
|---|---|---|
| (0001−001)+(0002−001) | .... | (0001) IS CHANGED OFF→ON<br><br>(0002) IS CHANGED OFF→ON |
| (0001−002)+(0002−001) | .... | (0001) IS CHANGED ON→OFF<br><br>(0002) IS CHANGED ON→OFF |
| ⋮ | ⋮ | ⋮ |

FIG. 20

| DEVICE ID | STATE |
|---|---|
| 0001 | POWER ON |
| 0002 | POWER OFF |
| ⋮ | ⋮ |

MONITORING DEVICE, MONITORING SYSTEM, MONITORING METHOD, AND NON-TRANSITORY STORAGE MEDIUM

CROSS-REFERENCE TO RELATED APPLICATIONS

This application is a national phase application of International Application No. PCT/JP2015/051788, filed Jan. 23, 2015, and claims the priority of Japanese Application No. 2014-071122, filed Mar. 31, 2014, the content of both of which is incorporated herein by reference.

TECHNICAL FIELD

The present invention relates to a monitoring device, a monitoring system, a monitoring method, and a program.

BACKGROUND ART

In recent years, as smart meters have become widespread, technologies for supplying users with total power consumption (instantaneous values) in predetermined units (a household, a company, a floor of one building, or the like) have been standardized. By providing not only total power consumption in the predetermined units but also power consumption (instantaneous values) of an electrical device as a single body used in the predetermined units, measures for more precise power saving are expected to be prompted.

Power consumption of an individual electrical device can be ascertained, for example, by mounting a measuring instrument on each electrical device. However, in the case of this method, a workload of mounting a measuring instrument on each electrical device is considerable. Further, a cost burden increases since the number of measurement instruments increases with an increase in the number of electrical devices.

The related technologies are disclosed in Patent Documents 1 to 6.

Patent Documents 1 and 2 disclose technologies for installing a measuring instrument in a power trunk line portion such as a power-feeding service entrance or a distribution board and inferring an operation state of each electrical device using measurement data (a total current consumption waveform or the like) measured with the measuring instrument. In the technologies, a feature amount (a training feature amount) at the time of operation of each electrical device is prepared in advance and a sum training feature amount in which the training feature amounts are summed in any combination is further prepared in advance. Then, based on feature amounts extracted from the measurement data measured in the power trunk line portion and the training feature amounts (including the sum training feature amounts) prepared in advance, an operation state of each electrical device is inferred.

Patent Document 3 discloses a technology for generating a training feature amount indicating a feature amount at the time of an operation of each electrical device. Specifically, pieces of predetermined data (current consumption or the like) are individually measured by operating electrical devices in a house to be measured one by one. A feature amount is extracted from the measured data of each of the electrical devices and the extracted feature amount is stored as a training feature amount.

Patent Document 4 discloses a power consumption measurement system that includes a data extraction unit and an inference unit. The data extraction unit extracts averaged current waveform data averaged per one period of a commercial frequency of a total load current based on a total load current and a voltage measured at a predetermined position of a leading wire in an area of demand and extracts convex point information regarding a convex point indicating a point at which change in a current value is changed from an increase to a decrease or a point at which the change in the current value is changed from the decrease to the increase from the averaged current waveform data. The inference unit retains an inference model in which a classification of an electrical device, the convex point information, and power consumption are associated with each other in advance and individually infers the power consumption of the electrical device being in operation based on the convex point information extracted by the data extraction unit and the inference model.

Patent Document 5 discloses a remote electrical device monitoring method of inferring operation statuses of a plurality of electrical devices used by a customer. In the method, a total load current is measured at a power feeding line of a customer, the total load current is converted into a current for the basic wave and each harmonic, and a temporal difference in the current for the basic wave and each harmonic is obtained to generate current change data. The current change for the basic wave and each harmonic is separated into each component inferred as a device group having an identical harmonic intensity ratio through independent component analysis. Then, an operation status (current change) of each monitoring target device is inferred from the waveform of the current change for each component having an identical harmonic intensity ratio.

Patent Document 6 discloses a power consumption amount inference device that infers a power consumption amount of a load device to which power is supplied from a power system. The device receives an operation state signal indicating a value according to an operation state of a load device and determines whether the load device is an operated load device in an operation state based on the value indicated by the received operation state signal. As an inferred power consumption amount of a newly operated load device, a change amount in the total power consumption amount before and after the change is allocated. A previously allocated inferred power consumption amount is allocated as an inferred power consumption amount of an operated load device other than the newly operated load device to the operated load device.

RELATED DOCUMENT

Patent Document

[Patent Document 1] Japanese Patent No. 3403368
[Patent Document 2] Japanese Patent No. 4565511
[Patent Document 3] Japanese Patent No. 4433890
[Patent Document 4] Japanese Laid-open Patent Application Publication No. 2011-232061
[Patent Document 5] Japanese Laid-open Patent Application Publication No. 2003-9430
[Patent Document 6] Japanese Laid-open Patent Application Publication No. 2010-169567

SUMMARY OF THE INVENTION

Technical Problem

The present inventors have examined a technology for calculating power consumption (instantaneous value) of each monitoring target electrical device based on a monitoring feature amount extracted from measurement data (a total current consumption waveform or the like in a predetermined unit) measured in a distribution board or the like, a training feature amount prepared for each monitoring target electrical device, and a the training feature amount (sum training feature amount) of each combination of monitoring target electrical devices generated by combining the training feature amounts for each monitoring target electrical device.

In the case of the technology, as the number of monitoring target electrical devices increases, the number of training feature amounts (including the sum training feature amounts) used for a process of inferring power consumption of the monitoring target electrical devices increases. In particular, when the number of monitoring target electrical devices increases, the number of combinations of the monitoring target electrical devices considerably increases, and thus the number of sum training feature amounts considerably increases. In a case in which M is the number of monitoring target electrical devices, there are $_MC_M+_MC_{M-1}, _MC_{M-2}, \ldots +_MC_2$ combinations of the monitoring target electrical devices. It is necessary to prepare the sum training feature amounts corresponding to the number of combinations.

In a case in which the power consumption of each monitoring target electrical device is inferred, it is necessary to prepare the training feature amount corresponding to each of a plurality of power consumption states for each monitoring target electrical device. Therefore, combinations for preparing the sum training feature amounts are obtained by further subdividing each combination of the monitoring target electrical devices. As a result, the number of prepared training feature amounts further increases.

In the case of the technology, as described above, there is a problem that the number of training feature amounts (including the sum training feature amounts) used for the inference process is enormous. In this case, a processing load on the process of inferring the power consumption of each monitoring target electrical device using the training feature amount (including the sum training feature amount) increases.

An object of the present invention is to provide a technology for reducing the number of training feature amounts (including sum training feature amounts) used to infer power consumption of each monitoring target electrical device.

Solution to Problem

According to an aspect of the present invention, there is provided a monitoring device including: a unit-specific waveform data acquisition unit that acquires unit-specific monitoring waveform data which is waveform data of at least one among total current consumption, a total input voltage, and total power consumption in a unit in which monitoring target electrical devices are installed; a first inference unit that infers change in operation states of at least some of the monitoring target electrical devices based on a first monitoring difference group including at least one of at least one kind of feature amount extracted from waveform data of a difference between waveform data of a first timing and waveform data of a second timing in the unit-specific monitoring waveform data, and at least one kind of difference in feature amounts extracted from the waveform data of the first timing and the waveform data of the second timing, and training difference information regarding a difference between a first operation state and a second operation state of each of the monitoring target electrical devices; and a second inference unit that infers an operation state of each of the monitoring target electrical devices based on an inference result of the first inference unit.

According to another aspect of the present invention, there is provided a program causing a computer to function as: a unit-specific waveform data acquisition unit that acquires unit-specific monitoring waveform data which is waveform data of at least one among total current consumption, a total input voltage, and total power consumption in a unit in which monitoring target electrical devices are installed; a first inference unit that infers change in operation states of at least some of the monitoring target electrical devices based on a first monitoring difference group including at least one among at least one kind of feature amount extracted from waveform data of a difference between waveform data of a first timing and waveform data of a second timing in the unit-specific monitoring waveform data, and at least one kind of difference in feature amounts extracted from the waveform data of the first timing and the waveform data of the second timing, and training difference information regarding a difference between a first operation state and a second operation state of each of the monitoring target electrical devices; and a second inference unit that infers an operation state of each of the monitoring target electrical devices based on an inference result of the first inference unit.

According to still another aspect of the present invention, there is provided a monitoring method performed by a computer, the method including: a unit-specific waveform data acquisition step of acquiring unit-specific monitoring waveform data which is waveform data of at least one among total current consumption, a total input voltage, and total power consumption in a unit in which monitoring target electrical devices are installed; a first inference step of inferring change in operation states of at least some of the monitoring target electrical devices based on a first monitoring difference group including at least one among at least one kind of feature amount extracted from waveform data of a difference between waveform data of a first timing and waveform data of a second timing in the unit-specific monitoring waveform data, and at least one kind of difference in feature amounts extracted from the waveform data of the first timing and the waveform data of the second timing, and training difference information regarding a difference between a first operation state and a second operation state of each of the monitoring target electrical devices; and a second inference step of inferring an operation state of each of the monitoring target electrical devices based on an inference result of the first inference unit.

According to still another aspect of the present invention, there is provided a monitoring system including: the monitoring device; and a repeating device that acquires unit-specific monitoring waveform data which is waveform data of at least one among total current consumption, a total input voltage, and total power consumption measured by a measuring instrument installed in a unit in which monitoring target electrical devices are installed and transmits the unit-specific monitoring waveform data to the monitoring device.

Advantageous Effects of Invention

According to the present invention, it is possible to reduce the number of training feature amounts (including sum training feature amounts) used to infer operation states of electrical devices.

BRIEF DESCRIPTION OF THE DRAWINGS

The above-described objects, other objects, features, and advantages will be apparent throughout preferred exemplary embodiments to be described below and the following drawings appended to the exemplary embodiments.

FIG. 3 is a diagram schematically illustrating an example of training difference information according to the present exemplary embodiment.

FIG. 5 is a diagram schematically illustrating an example of sum training difference information according to the present exemplary embodiment.

FIG. 8 is a diagram schematically illustrating an example of management information according to the present exemplary embodiment.

FIG. 9 is a diagram schematically illustrating an example of training data according to the present exemplary embodiment.

FIG. 10 is a diagram schematically illustrating an example of the training data according to the present exemplary embodiment.

FIG. 17 is a diagram schematically illustrating an example of an output example by an output unit according to the present exemplary embodiment.

FIG. 18 is a diagram schematically illustrating an example of the training difference information according to the present exemplary embodiment.

FIG. 19 is a diagram schematically illustrating an example of the sum training difference information according to the present exemplary embodiment.

FIG. 20 is a diagram schematically illustrating an example of the management information according to the present exemplary embodiment.

DESCRIPTION OF EXEMPLARY EMBODIMENTS

Hereinafter, a hardware configuration of a device according to a present exemplary embodiment will be described. Each unit included in the device according to the present exemplary embodiment is constituted by any combination of hardware and software with a focus on a central processing unit (CPU), a memory, a program loaded on the memory (also including a program which is stored in the memory in advance when shipping out the device and a program which is downloaded from a storage medium such as a compact disc (CD), or a server or the like on the Internet) of any computer, a storage unit such as a hard disk which stores the program, and an interface for network connection. In addition, those skilled in the art can understand that various modifications can be made to examples for realizing the method and device.

Figure 1:
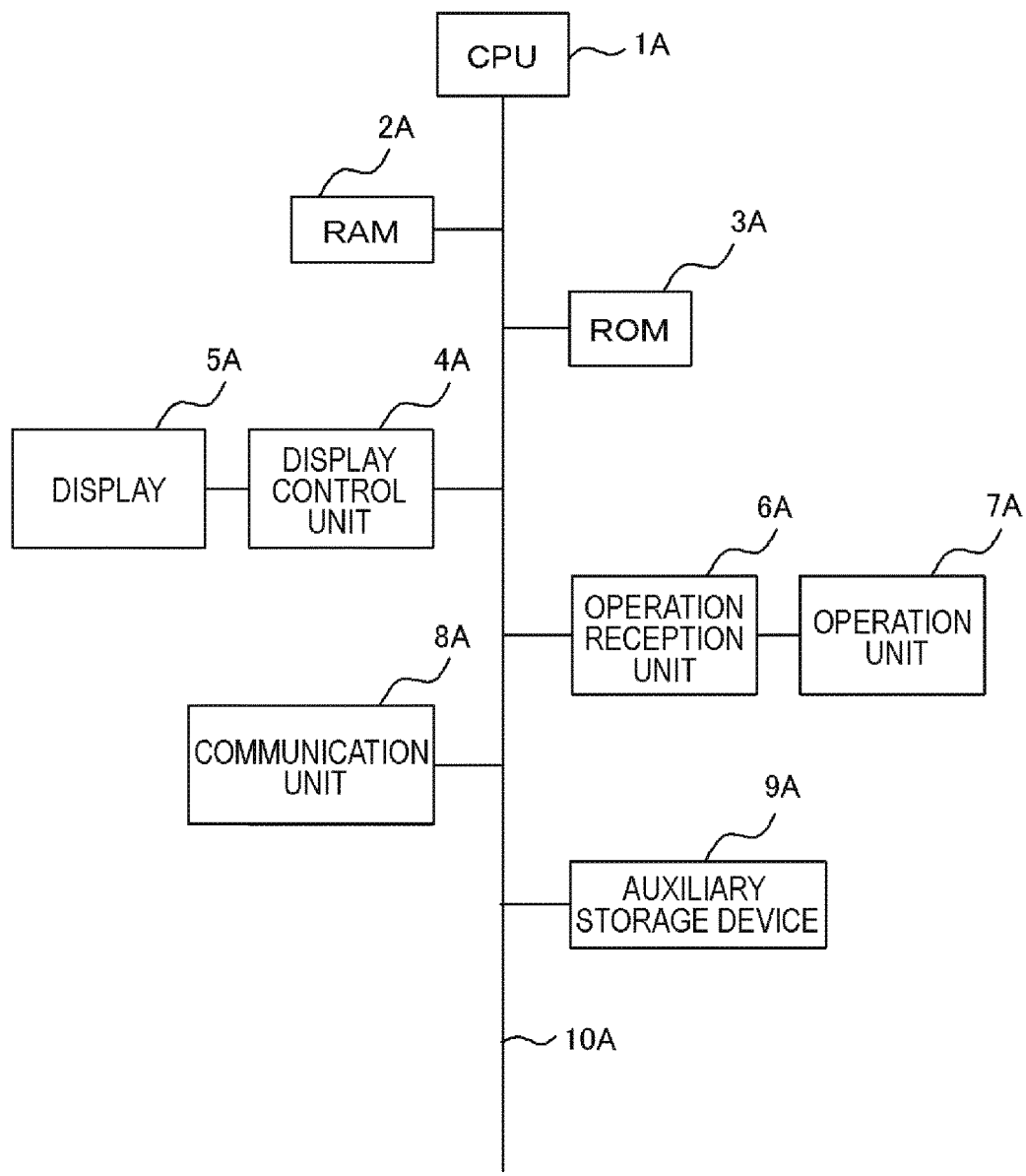
FIG. 1 is a diagram conceptually illustrating an example of a hardware configuration of a device according to a present exemplary embodiment.

FIG. 1 is a diagram conceptually illustrating an example of a hardware configuration of a device according to the present exemplary embodiment. As illustrated, the device according to the present exemplary embodiment includes, for example, a CPU 1A, a random access memory (RAM) 2A, a read-only memory (ROM) 3A, a display control unit 4A, a display 5A, an operation reception unit 6A, an operation unit 7A, a communication unit 8A, and an auxiliary storage device 9A connected to each other through a bus 10A. Although not illustrated, the device may additionally include other elements such as input and output interfaces connected to external devices in a wired manner, a microphone, and a speaker.

The CPU 1A controls each element and an entire computer of the device. The ROM 3A includes areas which store a program causing a computer to operate or various application program and various kinds of setting data used when such a program operates. The RAM 2A includes an area which temporarily stores data, such as a work area in which a program operate. The auxiliary storage device 9A is, for example, a hard disk drive (HDD) and can store large-volume data.

The display 5A is configured as, for example, a display device (for example, a light emitting diode (LED) display, a liquid crystal display, or an organic electroluminescence (EL) display). The display 5A may be a touch panel display integrated with a touch pad. The display control unit 4A reads data stored in a video RAM (VRAM), performs a predetermined process on the read data, and then transmits the data to the display 5A to display various screens. The operation reception unit 6A receives various operations through the operation unit 7A. The operation unit 7A includes an operation key, an operation button, a switch, a jog dial, a touch panel display, a keyboard, and the like. The communication unit 8A is connected to a network such as the Internet or a local area network (LAN) in a wired and/or wireless manner to communicate with other electrical device.

Hereinafter, the present exemplary embodiment will be described. Functional block diagrams used to describe the following exemplary embodiments illustrate blocks in units of functions rather than configurations in units of hardware. In the drawings, each device is constituted by a single device in the description, but constitution methods are not limited thereto. That is, each device may, of course, have a physically divided configuration or a logically divided configuration. The same reference numerals are given to the same constituent elements and the description thereof will not be appropriately repeated.

<First Exemplary Embodiment>

An overview of a present exemplary embodiment will be described. A monitoring device 10 according to the present exemplary embodiment first infers power consumption (operation state) of each monitoring target electrical device at a predetermined timing. Management information indicating the inferred power consumption (operation state) of each monitoring target electrical device is retained.

Thereafter, the monitoring device 10 monitors change in the power consumption (change in the operation state) of the monitoring target electrical device. When the change in the power consumption (the change in the operation state) of the monitoring target electrical device is detected, the management information is updated based on a detected result. The monitoring device 10 infers power consumption (the operation state) of each monitoring target electrical device at the predetermined timing by reference to the management information.

Figure 2:
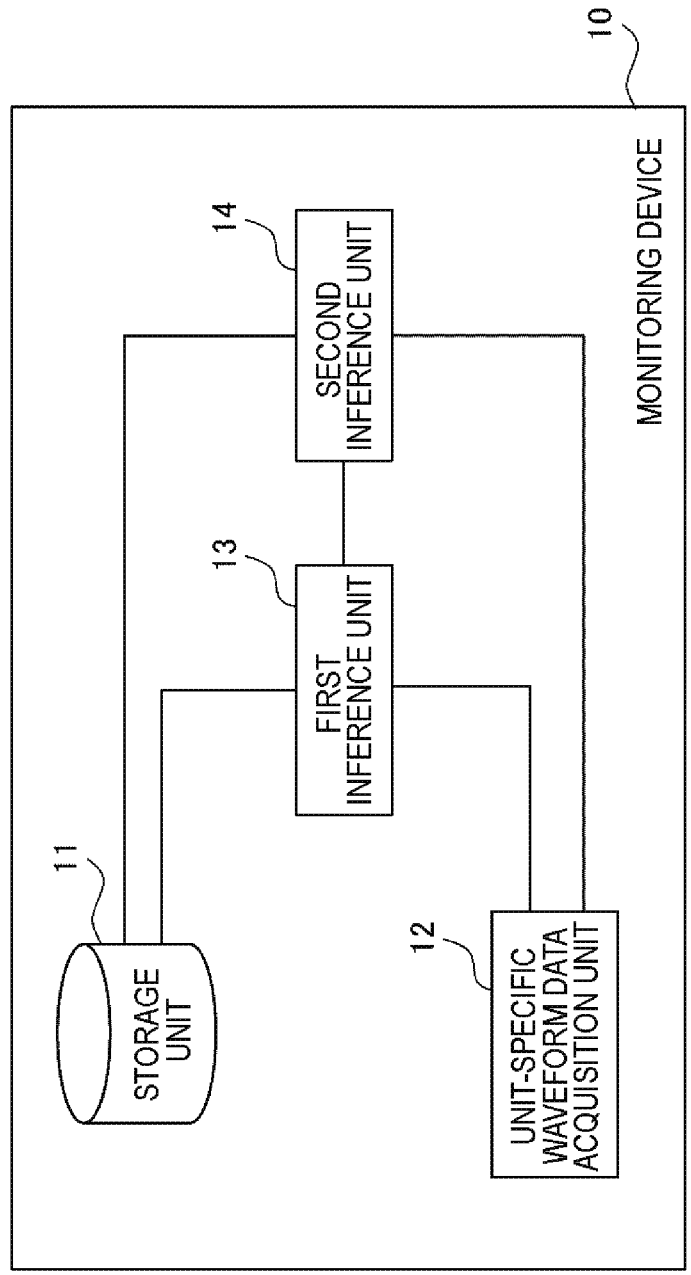
FIG. 2 is an exemplary functional block diagram illustrating a monitoring device according to the present exemplary embodiment.
Figure 26:
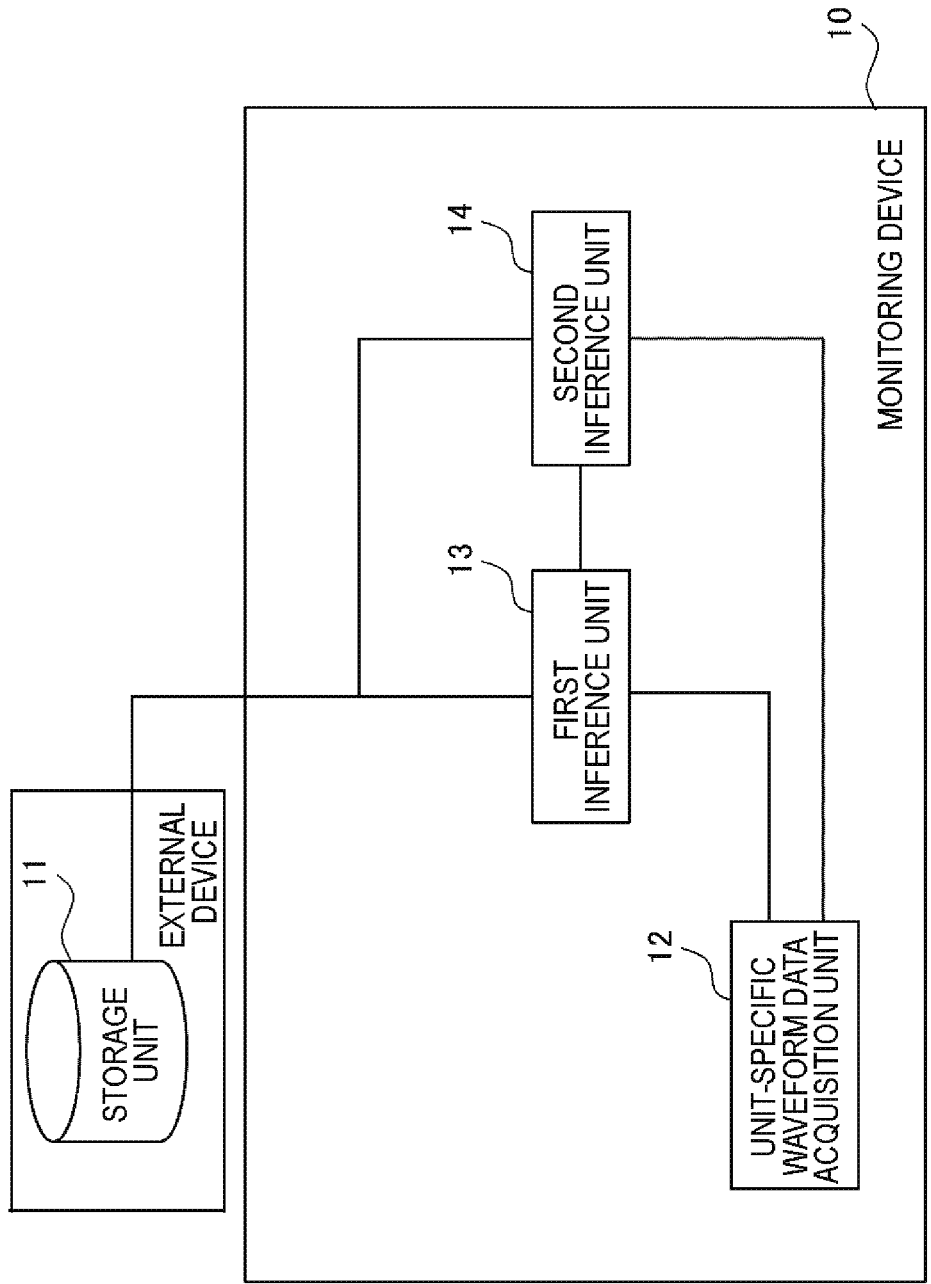
FIG. 26 is an exemplary functional block diagram illustrating the monitoring device according to the present exemplary embodiment.

Next, a configuration according to the present exemplary embodiment will be described in detail. FIG. 2 illustrates an exemplary functional block diagram illustrating the monitoring device 10 according to the present exemplary embodiment. As illustrated, the monitoring device 10 includes a storage unit 11, a unit-specific waveform data acquisition unit 12, a first inference unit 13, and a second inference unit 14. FIG. 26 illustrates another exemplary functional block diagram illustrating the monitoring device 10 according to the present exemplary embodiment. As illustrated, this example is different from the example of FIG. 2 in that the monitoring device 10 does not include the storage unit 11. In this case, the storage unit 11 is provided in a device different from the monitoring device 10. The monitoring device 10 communicates with the device in a wired and/or wireless manner and acquires information stored in the storage unit 11.

The storage unit 11 stores training difference information which is at least one of the following (1) to (3) in association with each of the monitoring target electrical devices.

(1) Waveform data of a difference between waveform data of at least one among current consumption, an input voltage, and power consumption in a first operation state, and waveform data in a second operation state.

(2) At least one kind of feature amount extracted from the waveform data of the difference of (1).

(3) A difference in at least one kind of feature amount extracted from the waveform data in the first operation state and the waveform data in the second operation state.

In the case of the present exemplary embodiment, the first operation state and the second operation state correspond to a state in which mutually different predetermined powers are consumed.

The feature amount may be a feature amount which can be extracted from the waveform data and may be, for example, a frequency intensity/phase (harmonic component) of current consumption, a phase, change in current consumption, an average value, a peak value, an effective value, a peak factor, a form factor, a convergence time of a current change, an energization time, the position of a peak, a time difference between a peak position of a voltage and a peak position of current consumption, a power factor, or a component with a specific frequency (½ period, ⅓ period, or the like). Of course, the feature amount is not limited to these examples.

FIG. 3 schematically illustrates an example of training difference information corresponding to the foregoing (2) and (3). In the training difference information illustrated in FIG. 3, a training data ID, a device ID, the first operation state, the second operation state, and a feature amount are associated with each other. The training difference information of the training data ID "0001-003" includes training feature amount when the power consumption of the monitoring target electrical device with the device ID "0001" is changed from 5 W to 10 W. The training feature amount may be one kind of feature amount or may be a combination of a plurality of kinds of feature amounts.

Figure 4:
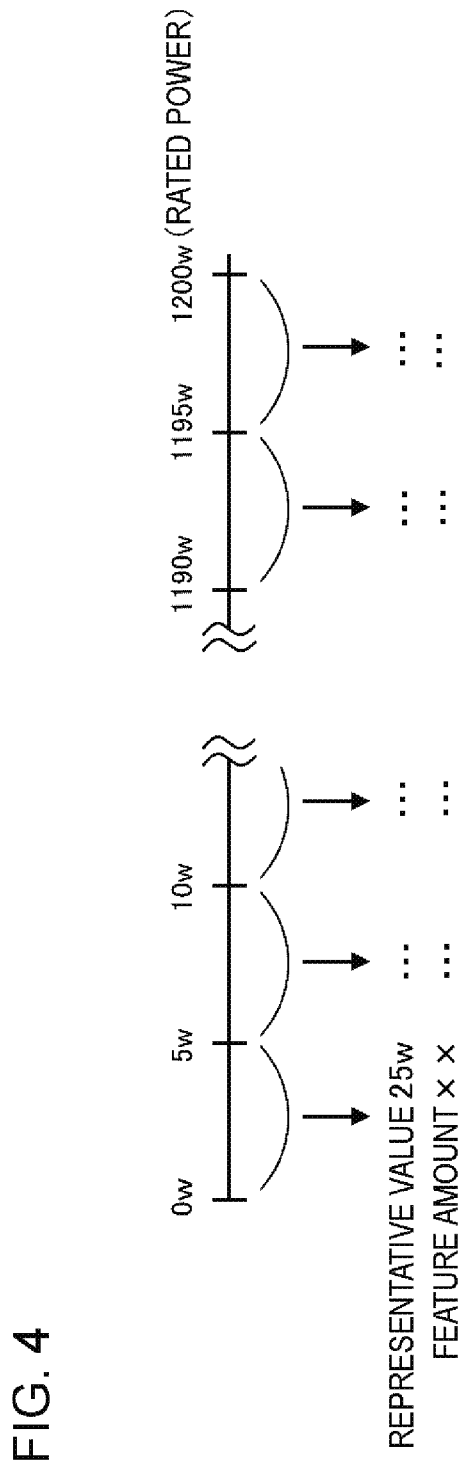
FIG. 4 is a diagram illustrating an overview of the training difference information according to the present exemplary embodiment.

The training difference information can be generated in the following way, for example. First, as illustrated in FIG. 4, a range from 0 W to a rated power is divided into arbitrary groups with a predetermined power value width for each monitoring target electrical device. The power value width of each group and the number of groups may be decided for each monitoring target electrical device. In the case of the example illustrated in FIG. 4, a range from 0 W to 1200 W (rated power) is divided into a plurality of groups with a power value width of 5 W.

A representative value (power consumption) is decided for each group. The representative value can be set to, for example, a statistical value (an average value, a maximum value, a minimum value, a median value, or the like) of the power value band included in each group.

Thereafter, the waveform data (for example, waveform data corresponding to a predetermined period) of a timing at which any of the power values in each group is consumed is extracted from device-specific training waveform data which is waveform data of at least one among current consumption, an input voltage, and power consumption prepared in advance for each monitoring target electrical device. The extracted waveform data is made to be associated with each group. In a case in which a plurality of pieces of waveform data (for example, the waveform data corresponding to the predetermined period) corresponding to each group are extracted from the device-specific training waveform data, any of the pieces of waveform data may be set as representative waveform data or average data of the pieces of waveform data may be set as representative waveform data.

As described above, the representative value (power consumption) and the waveform data at the time of consumption of the power value of each group are associated with each group. The waveform data (representative waveform data) associated with each group is treated as waveform data at the time of an operation state at which the power of the representative value of each group is consumed.

Thereafter, by generating all of the possible pairs from the plurality of groups and for each pair, calculating a difference between pieces of the waveform data associated with the groups (for example, a difference obtained by subtracting one from the other or a reverse difference), it is possible to obtain the waveform data of the foregoing (1). By extracting a predetermined feature amount from the obtained waveform data of the (1), it is possible to obtain the feature amount of the foregoing (2).

On the other hand, by extracting the predetermined feature amount from each piece of waveform data (representative waveform data) associated with each group and subsequently calculating a difference (for example, a difference obtained by subtracting one from the other or a reverse difference) in the feature amount for each pair, it is possible to obtain the feature amount of the foregoing (3).

The flow of the generation herein is merely an example and the present invention is not limited thereto.

The storage unit 11 may store sum training difference information generated by combining the training difference information (see FIG. 3) corresponding to each of the monitoring target electrical devices. FIG. 5 schematically illustrates an example of the sum training difference information.

In the sum training difference information illustrated in FIG. 5, the training data ID, the sum training feature amount, and a state are associated with each other. Sum training difference information of a training data ID "(0001-003)+ (0002-003)" is generated based on the training difference information of a training data ID "0001-003" and the training difference information of a training data ID "0002- 003" illustrated in FIG. 3. The sum training difference information includes a training feature amount (sum training feature amount) when the power consumption of a monitoring target electrical device with a device ID "0001" is changed from 5 W to 10 W and the power consumption of a monitoring target electrical device with a device ID "0002" is changed from 10 W to 50 W.

It is rare that all of the operation states of the plurality of monitoring target electrical devices are simultaneously changed. For this reason, the sum training difference information may not necessarily correspond to all of the combinations of the plurality of monitoring target electrical devices and may correspond to some of the combinations. That is, in a case in which the sum training difference information is to be stored in advance in the storage unit 11, the sum training difference information corresponding to only a combination generated by selecting from the plurality of monitoring target electrical devices the monitoring target electrical devices of equal to or less than α (design factor)+ the number of monitoring target electrical devices of which the operation states are predicted to be simultaneously changed may be stored in the storage unit 11.

For example, in a case in which the number of monitoring target electrical devices is M, the number of monitoring target electrical devices of which the operation states are simultaneously changed is set to 2, and α is set to 1, the sum training difference information corresponding to only to a combination in which 3 arbitrary monitoring target electrical devices are extracted from M monitoring target electrical devices, and a combination in which 2 arbitrary monitoring target electrical devices are extracted from M monitoring target electrical devices may be stored in the storage unit 11.

The combination in which 3 arbitrary monitoring target electrical devices are extracted from M monitoring target electrical devices and the combination in which 2 arbitrary monitoring target electrical devices are extracted from M monitoring target electrical devices are further subdivided in accordance with a plurality of pieces of training difference information (see FIG. 3) associated with each of the monitoring target electrical devices.

The subdivision will be described exemplifying the combination (M1 and M2) in which 2 arbitrary monitoring target electrical devices are extracted from M monitoring target electrical devices. For simplicity, only M1-1 training difference information in which (the first operation state and the second operation state) are states of (5 W consumption and 10 W consumption) and M1-2 training difference information in which (the first operation state and the second operation state) are states of (10 W consumption and 5 W consumption) are assumed to correspond to a monitoring target electrical device M1. Further, M2-1 training difference information in which (the first operation state and the second operation state) are states of (10 W consumption and 20 W consumption), M2-2 training difference information in which (the first operation state and the second operation state) are states of (10 W consumption and 30 W consumption), M2-3 training difference information in which (the first operation state and the second operation state) are states of (20 W consumption and 30 W consumption), M2-4 training difference information in which (the first operation state and the second operation state) are states of (20 W consumption and 10 W consumption), and M2-5 training difference information in which (the first operation state and the second operation state) are states of (30 W consumption and 10 W consumption), and M2-6 training difference information in which (the first operation state and the second operation state) are states of (30 W consumption and 20 W consumption) are assumed to correspond to a monitoring target electrical device M2.

In this case, the combination of (M1 and M2) is subdivided into combinations of (the M1-1 training difference information and the M2-1st training difference information), (the M1-1 training difference information and the M2-2 training difference information), (the M1-1 training difference information and the M2-3 training difference information), (the M1-1 training difference information and the M2-4 training difference information), (the M1-1 training difference information and the M2-5 training difference information), (the M1-1 training difference information and the M2-6 training difference information), (the M1-2 training difference information and the M2-1 training difference information), (the M1-2 training difference information and the M2-2 training difference information), (the M1-2 training difference information and the M2-3 training difference information), (the M1-2 training difference information and the M2-4 training difference information), (the M1-2 training difference information and the M2-5 training difference information), and (the M1-2 training difference information and the M2-6 training difference information). The storage unit 11 may store the sum training difference information corresponding to each of the combinations.

Referring back to FIG. 2, the unit-specific waveform data acquisition unit 12 acquires unit-specific monitoring waveform data which is waveform data of at least one among total current consumption, a total input voltage, and total power consumption in a unit (a household, a branch unit of a distribution board, a company, one floor of one building, or the like) in which the monitoring target electrical devices are installed. Such unit-specific monitoring waveform data may be acquired through, for example, a measuring instrument installed near a power trunk line portion such as a distribution board.

The unit-specific waveform data acquisition unit 12 may acquire the unit-specific monitoring waveform data through a real-time process or may acquire the unit-specific monitoring waveform data corresponding to a predetermined time (for example, 1 minutes, 30 minutes, 1 hour, or 24 hours) collectively through a batch process. In a case in which a power consumption value (instantaneous value) of the monitoring target electrical device is supplied to a user in real time, the unit-specific waveform data acquisition unit 12 acquires the unit-specific monitoring waveform data through the real-time process.

The first inference unit 13 infers change in operation states of at least some of the monitoring target electrical devices based on a first monitoring difference group including at least one of the following (4) and (5) extracted from the unit-specific monitoring waveform data and the training difference information stored in the storage unit 11.

(4) At least one kind of feature amount extracted from waveform data of a difference between waveform data of a first timing and waveform data of a second timing in the unit-specific monitoring waveform data.

(5) A difference in at least one kind of feature amount extracted from the waveform data of the first timing and the waveform data of the second timing.

Figure 6:
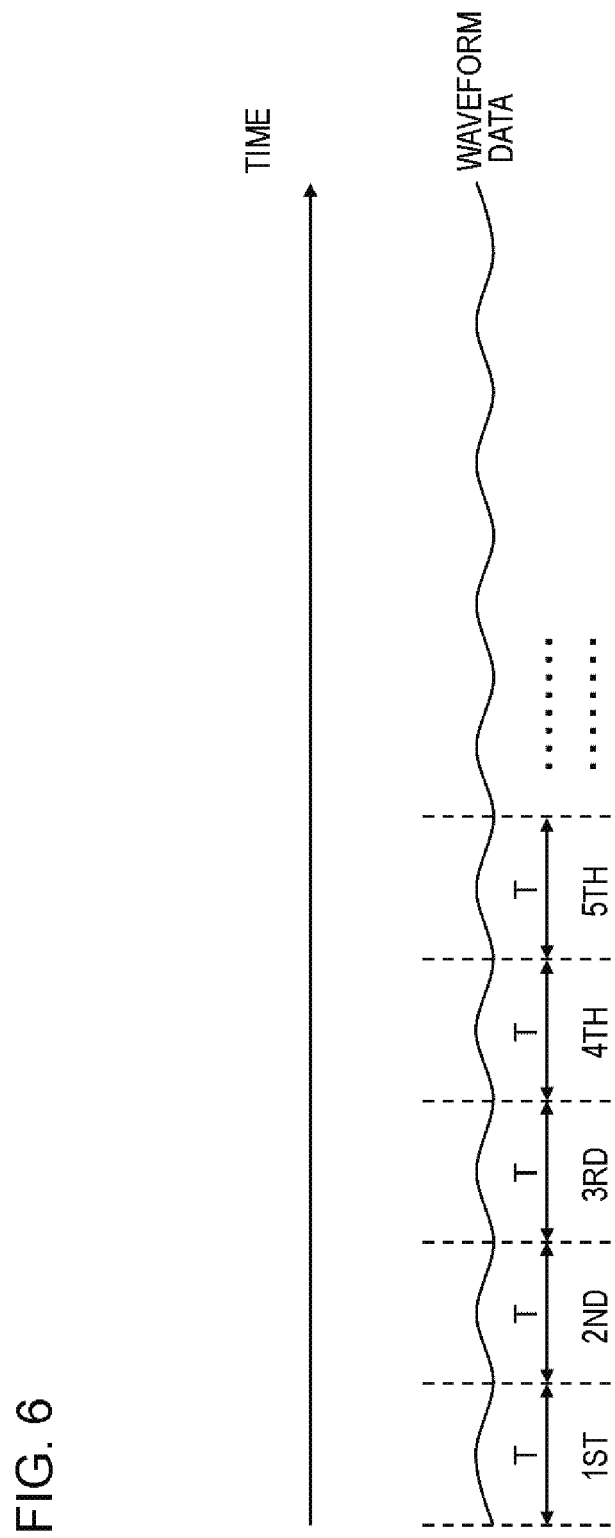
FIG. 6 is a diagram illustrating a process of generating difference information from unit-specific monitoring waveform data.
Figure 7:
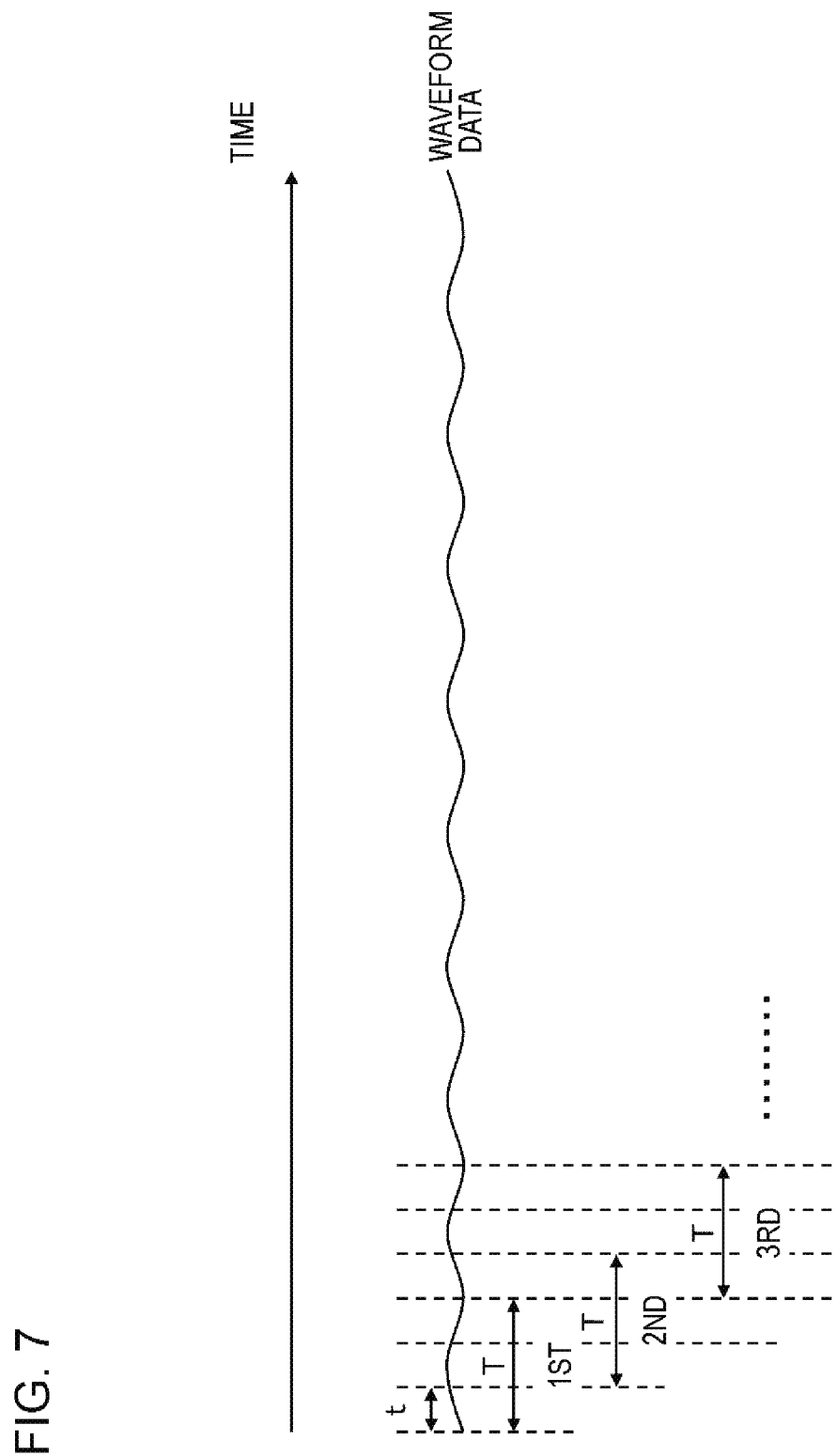
FIG. 7 is a diagram illustrating a process of generating the difference information from unit-specific monitoring waveform data.

Here, an example of a process of generating the data of the foregoing (4) and (5) will be described with reference to FIGS. 6 and 7. First, as illustrated in FIGS. 6 and 7, the unit-specific monitoring waveform data is partitioned along a time axis according to a pre-decided rule to be divided into a plurality of processing unit groups. In the case of FIG. 6, the unit-specific monitoring waveform data is partitioned for each time T (for example, a predetermined period) to be divided into a plurality of processing unit groups. In the case of FIG. 6, the plurality of processing unit groups are not overlapped. In the case of FIG. 7, by setting the length of one processing unit group to a time T (for example, a predetermined period) and shifting the group by a predetermined time t (greater than 0), the unit-specific monitoring waveform data is divided into the plurality of processing unit groups. In the case of t<T, the plurality of processing unit groups are overlapped. In the case of t=T, the same case as FIG. 6 is obtained. In the case of t>T, data included in none of the processing unit groups occurs.

The waveform data of the first timing is waveform data included in one (first processing unit group) in the plurality of processing unit groups set in the above-described way. The waveform data of the second timing is waveform data included in a processing unit group (second processing unit group) different from the first processing unit group. The first processing unit group and second processing unit group may be two temporally consecutive processing unit groups (for example, two processing unit groups of which numerals are consecutive in the cases illustrated in FIGS. 6 and 7).

By calculating a difference between the waveform data of the first processing unit group and the waveform data of the second processing unit group and extracting a predetermined feature amount from the waveform data of the difference, it is possible to obtain the feature amount of the foregoing (4). On the other hand, by extracting the predetermined feature amounts from waveform data of the first and waveform data of second processing unit groups and subsequently calculating a difference between the extracted feature amounts, it is possible to obtain the feature amount of the foregoing (5).

The flow of the generation herein is merely an example and the present invention is not limited thereto.

In the present exemplary embodiment, based on the first monitoring difference group including at least one of the (4) and (5) and, the training difference information stored in the storage unit 11 as illustrated in FIG. 3, and the sum training difference information illustrated in FIG. 5, the first inference unit 13 infers whether the power consumption of at least some of the monitoring target electrical devices is changed and infers the details (which monitoring target electric devices are changed from which operation state to which operation state) of the change when the power consumption is changed.

For example, the first inference unit 13 may obtain the inference result by generating an inference model using the training difference information (see FIG. 3) and the sum training difference information (see FIG. 5) as training data and inputting a value (feature amount) of the first monitoring difference group into the generated inference model. The first monitoring difference group is configured to include the same kind of feature amount as the feature amount (including the sum feature amount) used to generate the inference model used by the first inference unit 13. In the inference model, for example, multiple regression analysis, a neural network, or a genetic algorithm may be used.

In a case in which the storage unit 11 does not store the sum training difference information illustrated in FIG. 5, the first inference unit 13 generates sum training difference information using the training difference information stored in the storage unit 11. In a case in which the storage unit 11 retains the waveform data of the difference of the foregoing (1), the first inference unit 13 generates the feature amount of the foregoing (2) using the waveform data and generates the sum training difference information using the generated feature amount.

Referring back to FIG. 2, the second inference unit 14 infers an operation state of each monitoring target electrical device based on an inference result of the first inference unit 13. In the present exemplary embodiment, the second inference unit 14 infers the power consumption of the monitoring target electrical device.

Figure 8:
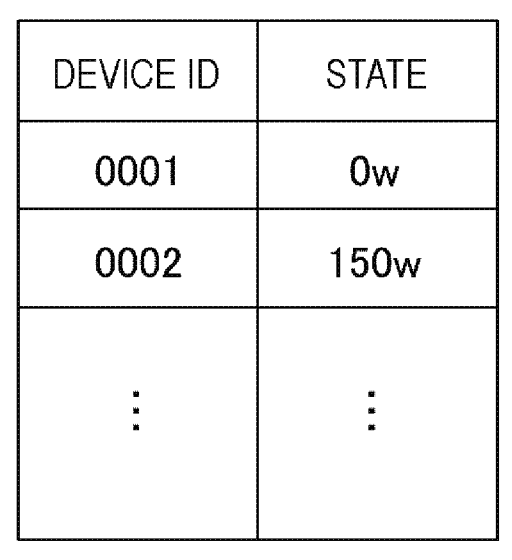

First, the second inference unit 14 infers the power consumption of each monitoring target electrical device at a predetermined timing. The management information (see FIG. 8) indicating inferred content is generated and retained. After the timing at which the management information is generated, the management information is updated based on change in the power consumption of the monitoring target electrical device inferred by the first inference unit 13. As a predetermined timing at which the second inference unit 14 infers the power consumption of each monitoring target electrical device, a first stage of starting a monitoring process by the monitoring device 10 or a timing of each predetermined time (for example, every 30 minutes, every hour, or every 6 hours) while the monitoring device 10 continues the monitoring process in addition to the first stage is considered.

Here, examples of a process of inferring the power consumption of each monitoring target electrical device in order for the second inference unit 14 to generate the management information will be described.

<Consumption Power Inference Process 1>

For example, in a state in which the power states of all the monitoring target electrical devices are an off-state, the monitoring device 10 receives an input indicating the off-state from, for example, a user. Then, the second inference unit 14 infers that the power consumption of all the monitoring target electrical devices is power consumption of 0 W at the time point of reception of the input. The process is proper for a case in which the process is performed in the first stage of starting the monitoring process by the monitoring device 10.

<Consumption Power Inference Process 2>

For example, the storage unit 11 stores the training data as illustrated in FIG. 9 or 10.

In the training data illustrated in FIG. 9, the training feature amount at the time of each power consumption is associated with each monitoring target electrical device. The training feature amount in this case is a feature amount extracted from the waveform data (for example, the waveform data corresponding to the predetermined period) at the time of each power consumption. In the training data illustrated in FIG. 9, a device ID, a training data ID, a power value band, a representative value, a training feature amount, and a state are associated with each other.

An overview of the training data in FIG. 9 will be described with reference to FIG. 4. In the case of the training data, a range from 0 W to the rated power is divided into arbitrary groups with a predetermined power value width for each monitoring target electrical device. The power value width of each group and the number of groups may be decided for each monitoring target electrical device. The representative value and the training feature amount are generated for each group.

In the case of the example illustrated in FIG. 4, the range from 0 W to 1200 W (rated power) is divided into a plurality of groups with a power value width of 5 W. A statistical value (an average value, a maximum value, a minimum value, a median value, or the like) of the power value band included in each group is set as a representative value. A feature amount extracted from the waveform data (for example, the waveform data corresponding to the predetermined period) at the time of consumption of one power in the power value band included in each group is set as a training feature amount.

Each training data ID illustrated in FIG. 9 corresponds to each of the above-described groups and the power value band indicates the power value band included in each group.

In the training data illustrated in FIG. 10, the training feature amount at the time of each power consumption is associated with each monitoring target electrical device. The training feature amount in this case is a feature amount extracted from the waveform data (for example, the waveform data corresponding to the predetermined period) at the time of each power consumption. In the training data illustrated in FIG. 10, a device ID, a training data ID, a power value band, a representative value, a training feature amount, and a state are associated with each other.

An overview of the training data in FIG. 10 will be described with reference to FIGS. 11 and 12. In the case of the training data, groups in which the representative value and the training feature amount are generated are partially set within a range from 0 W to the rated power for each monitoring target electrical device. The power value width of each group and the number of groups may be decided for each monitoring target electrical device. The representative value and the training feature amount are generated for each group.

Figure 11:
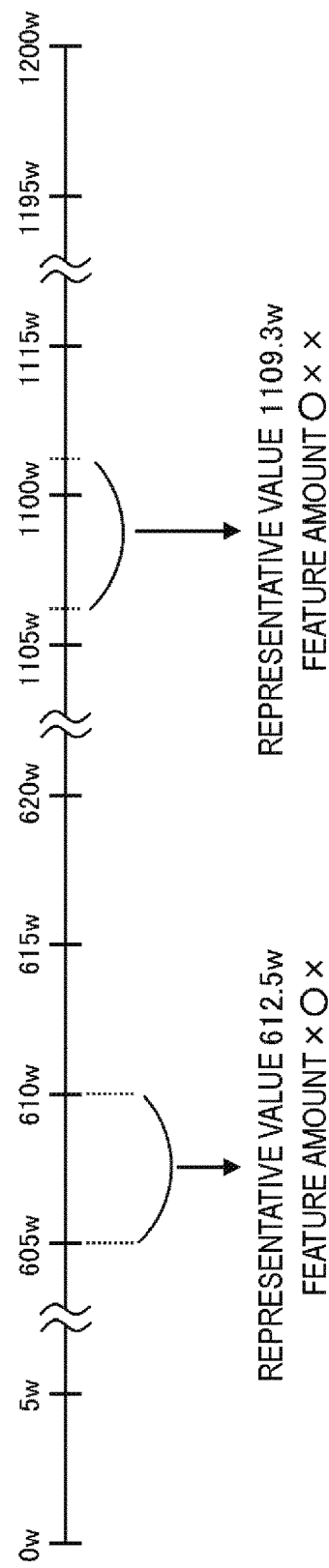
FIG. 11 is a diagram illustrating an overview of the training data in FIG. 10.
Figure 12:
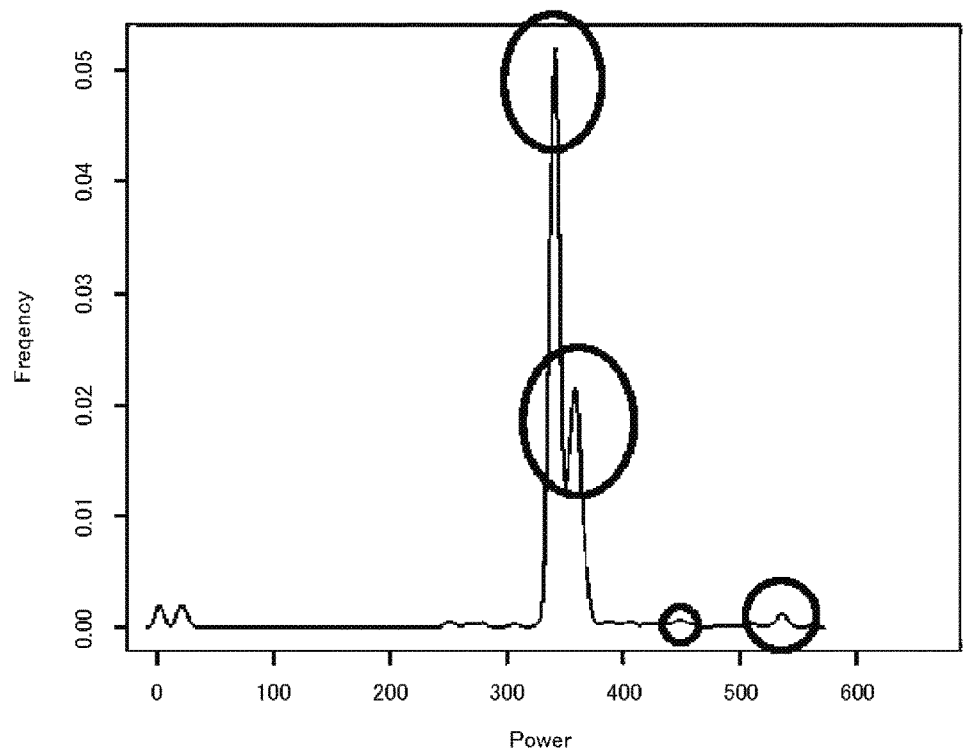
FIG. 12 is a diagram illustrating the overview of the training data in FIG. 10.

In the case of the example illustrated in FIG. 11, for example, the groups are set from 605 W to 610 W and from 1107 W to 1112 W. A statistical value (an average value, a maximum value, a minimum value, a median value, power consumption of highest rate of occurrence, or the like) of the power value band included in each group is set as a representative value. A feature amount extracted from the waveform data (for example, the waveform data corresponding to the predetermined period) at the time of consumption of one power in the power value band included in each group is set as a training feature amount.

Here, an example in which the groups in which the representative value and the training feature amount are generated are partially set within the range from 0 W to the rated power will be described. For example, for each monitoring target electrical device, the frequency analysis of the power consumption is performed using the device-specific training waveform data corresponding to a predetermined time. As a method for the frequency analysis, for example, a method of generating a frequency distribution curve and analyzing the frequency distribution curve, a method of generating a histogram and analyzing the histogram, or a method of dividing a power consumption band (greater than 0 W and equal or less than the rated power) which the processing target electrical devices can actually consume into a plurality of groups and counting the consumption power of each group is considered. However, the present invention is not limited thereto.

The generation of the frequency distribution curve may be achieved, for example, by performing kernel density inference. In this case, for example, a Gaussian kernel can be used in a kernel function and the band width of Silverman can be used in a band width. Another kernel function (for example, a polynomial) or another band width can also be used. FIG. 12 illustrates an example of the generated frequency distribution curve. The horizontal axis represents power consumption and the vertical axis represents the rate of occurrence.

Further, the group may beset so that a power value with relatively high rate of occurrence is included therein. A low power consumption band (for example, equal to or less than 10 percentages of the rated power) may be excluded from a group setting target.

The storage unit 11 may store the training data including the sum training feature amounts generated using the training data in which the training feature amount at the time of each power consumption is associated with each monitoring target electrical device. The sum training feature amount corresponds to all of the combinations of the plurality of monitoring target electrical devices. The combination is subdivided in accordance with the plurality of operation states of the plurality of monitoring target electrical devices and corresponds to all of the subdivided combinations.

The second inference unit 14 may infer the power consumption of the monitoring target electrical device based on the training data and the feature amount extracted from the unit-specific monitoring waveform data acquired by the unit-specific waveform data acquisition unit 12.

For example, the second inference unit 14 may obtain an inference result (the power consumption of the monitoring target electrical device) by generating an inference model using the training data and inputting the feature amount extracted from the unit-specific monitoring waveform data into the generated inference model. In the inference model, for example, multiple regression analysis, a neural network, or a genetic algorithm can be used.

The process is proper for a case in which the process is performed in a first stage of starting the monitoring process by the monitoring device 10 and a case in which the process is performed for each predetermined time (for example, every 30 minutes, every hour, or every 6 hours) while the monitoring device 10 continues the monitoring process.

By referring to, for example, the management information (see FIG. 8) generated through the power consumption inference processes 1 and 2 and updated based on the inference result by the first inference unit 13, the second inference unit 14 can infer the power consumption of each monitoring target electrical device not only at a timing at which the power consumption of the monitoring target electrical device is inferred through the consumption power inference processes 1 and 2 but also another timing.

Next, an example of the flow of a process of a monitoring method according to the exemplary embodiment will be described with reference to the flowchart of FIG. 13. Both of a real-time process and a batch process can be used as the process. The same also applies to all of the following exemplary embodiments. In the present exemplary embodiment, the description will be made in consideration of both of the processes. Since the following exemplary embodiments can be achieved similarly to the present exemplary embodiment, the description will not be repeated.

First, the unit-specific waveform data acquisition unit 12 acquires the unit-specific monitoring waveform data which is waveform data of at least one among the total current consumption, the total input voltage, and the total power consumption in the unit in which the monitoring target electrical devices are installed (S10).

For example, the unit-specific waveform data acquisition unit 12 acquires the unit-specific monitoring waveform data from the measuring instrument installed in a predetermined unit through the real-time process. In this case, the unit-specific waveform data acquisition unit 12 continues to acquire the unit-specific monitoring waveform data. Alternatively, the unit-specific waveform data acquisition unit 12 collectively acquires the unit-specific monitoring waveform data corresponding to the predetermined time through the batch process.

A "case of the real-time process" to be described below refers to a case in which the process of S11 is the real-time process and a "case of the batch process" refers to a case in which the process of S11 is the batch process.

Next, the second inference unit 14 extracts a predetermined kind of feature amount from the waveform data corresponding to the predetermined period (corresponding to a processing target) in the unit-specific monitoring waveform data acquired in S10. Then, the second inference unit 14 infers the power consumption of each of the plurality of monitoring target electrical devices and generates the management information (see FIG. 8).

For example, the second inference unit 14 generates the inference model using the training data including the training feature amount corresponding each power consumption of the monitoring target electrical device acquired from the storage unit 11 and the training data including the sum training feature amounts generated using the training data including the training feature amount and obtains the inference result (the power consumption of each monitoring target electrical device) by inputting the monitoring feature amount into the generated inference model.

In a case in which the storage unit 11 does not store the training data including the sum training feature amounts, the second inference unit 14 generates the training data including the sum training feature amounts using the training data including the training feature amount corresponding to each power consumption of the monitoring electrical device acquired from the storage unit 11. In a case in which the storage unit 11 stores the device-specific training waveform data and does not store the training data including the training feature amount corresponding to each power consumption, the second inference unit 14 acquires the device-specific training waveform data of the monitoring target electrical device from the storage unit 11 and generates the training data including the training feature amount corresponding to each power consumption using the device-specific training waveform data. The training data including the sum training feature amounts is generated using the generated training data including the training feature amount corresponding to each power consumption.

Then, the second inference unit 14 generates the inference model using the generated training data including the training feature amount corresponding to each power consumption of the monitoring target electrical device and the training data including the sum training feature amounts generated using the training data including the training feature amount and obtains the inference result (the power consumption of each monitoring target electrical device) by inputting the monitoring feature amount into the generated inference model.

In the case of the present exemplary embodiment, the monitoring target electrical devices which are processing targets of the second inference unit 14 are pre-decided (all). Therefore, the inference model may be generated in advance and stored in the storage unit 11. Then, the second inference unit 14 may extract the inference model from the storage unit 11 and perform the inference process.

Next, the first inference unit 13 extracts difference information (first monitoring difference group) configured to include the predetermined kind of feature amount from the unit-specific monitoring waveform data acquired in step S10 (S12).

In the case of the real-time process, the first inference unit 13 sets the waveform data after the timing at which the power consumption of the plurality of monitoring target electrical devices is inferred in S11 as a processing target, sets the latest waveform data corresponding to the predetermined period as the waveform data of the second timing, sets the waveform data corresponding to the predetermined period before the second timing (for example, immediately before the second timing) as the waveform data of the first timing, and generates the difference information using the processing target, the waveform data of the second timing, and the waveform data of the first timing.

On the other hand, in the case of the batch process, the first inference unit 13 sets the waveform data after the timing at which the power consumption of the plurality of monitoring target electrical devices is inferred in S11 in the unit-specific monitoring waveform data corresponding to the predetermined time as a processing target, sets the waveform data of the predetermined processing target corresponding to the predetermined period as the waveform data of the second timing, sets the waveform data corresponding to the predetermined period before the second timing (for example, immediately before the second timing) as the waveform data of the first timing, and extracts the difference information using the processing target, the waveform data of the second timing, and the waveform data of the first timing.

Thereafter, the first inference unit 13 infers whether the power consumption of the monitoring target electrical devices after the timing at which the power consumption of the plurality of monitoring target electrical device is inferred in S11 is changed or not and infers the details of the change in a case in which the power consumption is changed (S13). That is, the first inference unit 13 infers whether the power consumption is changed between the first timing and second timing set in S12 using the difference information (first monitoring difference group) extracted in S12 and infers the details of the change in the case in which the power consumption is changed.

For example, when the difference information (first monitoring difference group) extracted in S12 is acquired, the first inference unit 13 acquires the training difference information (see FIG. 3) including the training feature amount and the sum training difference information (see FIG. 5) generated using the training difference information from the storage unit 11. Then, the first inference unit 13 generates the inference model using the acquired training difference information (see FIG. 3) including the training feature amount and the sum training difference information (see FIG. 5) generated using the training difference information as the training data and obtains the inference result by inputting the value (feature amount) of the first monitoring difference group into the generated inference model.

In a case in which the storage unit 11 does not store the sum training difference information (see FIG. 5), the first inference unit 13 generates the sum training difference information (see FIG. 5) using the training difference information (see FIG. 3) including the training feature mount acquired from the storage unit 11. In a case in which the storage unit 11 stores the waveform data of the difference between the waveform data in the first operation state and the waveform data in the second operation state and does not store the training difference information (see FIG. 3) including the training feature amount, the first inference unit 13 acquires the waveform data of the difference from the storage unit 11 and generates the training difference information (see FIG. 3) including the training feature amount using the waveform data of the difference. The sum training difference information (see FIG. 5 or the like) is generated using the generated training difference information (see FIG. 3) including the training feature amount. The generated sum training difference information may correspond to only the combination generated by selecting the monitoring target electrical devices of equal to or less than α (design factor)+ the number of monitoring target electrical devices of which the operation states are predicted to be simultaneously changed.

The first inference unit 13 generates the inference model using the generated training difference information (see FIG. 3) including the training feature amount and the sum training difference information (see FIG. 5) generated using the training difference information as the training data and obtains the inference result by inputting the value (the feature amount) of the first monitoring difference group into the generated inference model.

The inference model may be generated in advance and stored in the storage unit 11. Then, the first inference unit 13 may extract the inference model from the storage unit 11 and perform the inference process.

In the case of the real-time process, the first inference unit 13 performs inference based on the latest waveform data corresponding to the predetermined period, and subsequently inputs the inference result to the second inference unit 14. On the other hand, in the case of the batch process, the first inference unit 13 inputs the inference result to the second inference unit 14 whenever the first inference unit 13 performs the inference based on one piece of waveform data corresponding to the predetermined period or whenever the first inference unit 13 performs the inference based on a predetermined number of pieces of waveform data corresponding to the predetermined period.

The second inference unit 14 receiving the inference result from the first inference unit 13 confirms whether the power consumption of the monitoring target electrical devices is changed. When the power consumption is changed (Yes in S14), the second inference unit 14 updates the management information based on the inference result (S16), and subsequently the process proceeds to S15. Conversely, when the power consumption is not changed (No in S14), the process proceeds to S15 without the updating. In S15, the second inference unit 14 infers the power consumption of each of the plurality of monitoring target electrical devices based on the latest management information. In the case of the batch process, the second inference unit 14 follows the processing target in order from the temporally previous inference result to confirm whether the power consumption is changed and updates the management information, as necessary.

In the case of the real-time process, the power consumption of each monitoring target electrical device is inferred at a certain time point (latest time point) through the foregoing processes. Then, the foregoing processes are repeated. On the other hand, in the case of the batch process, the change in the power consumption of each monitoring target electrical device is inferred within a certain time (the time of the unit-specific monitoring waveform data acquired in S11) through the foregoing processes.

In the case of the present exemplary embodiment, the second inference unit 14 can specify the power consumption of each of the plurality of monitoring target electrical device at the current time point with reference to the management information retained by the second inference unit 14. Therefore, the first inference unit 13 may generate the sum training difference information using only the training difference information of which the first operation state (the operation state before the change) matches the operation state at the current time point among the plurality of pieces of training difference information associated with the monitoring target electrical devices. Then, the first inference unit 13 may also generate the inference model using only the training difference information of which the first operation state (the operation state before the change) is identical to the operation state at the current time point and the sum training difference information generated using the training difference information. In this way, it is possible to further reduce the number of pieces of training difference information (including the sum training difference information) to be used.

In the case of the above-described present exemplary embodiment, when the power consumption of the plurality of monitoring target electrical devices is inferred only at the first time or at a subsequent predetermined timing, the power consumption of the plurality of monitoring target electrical devices at a certain time point (for example, the current time point) can be inferred by subsequently monitoring change in the power consumption of the monitoring target electrical devices.

As described above, it is rare that the power consumption of all the plurality of monitoring target electrical devices is simultaneously changed. Therefore, it is not necessary to prepare the feature amounts corresponding to all of the combinations as the feature amounts used to monitor the change in the power consumption of the plurality of monitoring target electrical devices. Further, it is sufficient to prepare the feature amounts corresponding to the combinations generated by taking out the monitoring target electrical devices of equal to or less than a (design factor)+the number of monitoring target electrical devices of which the power consumption is predicted to be simultaneously changed.

Therefore, it is possible to reduce a processing load more than a case in which the power consumption of each monitoring target electrical device is inferred using the training data including the training feature amount corresponding to each power consumption of the monitoring target electrical device and the training data including the sum training feature amounts generated using the training data including the training feature amount at all the timings.

Here, an application example of the monitoring device 10 according to the present exemplary embodiment will be described with reference to FIGS. 14 and 15. The application example is the same in all of the following exemplary embodiments.

Figure 14:
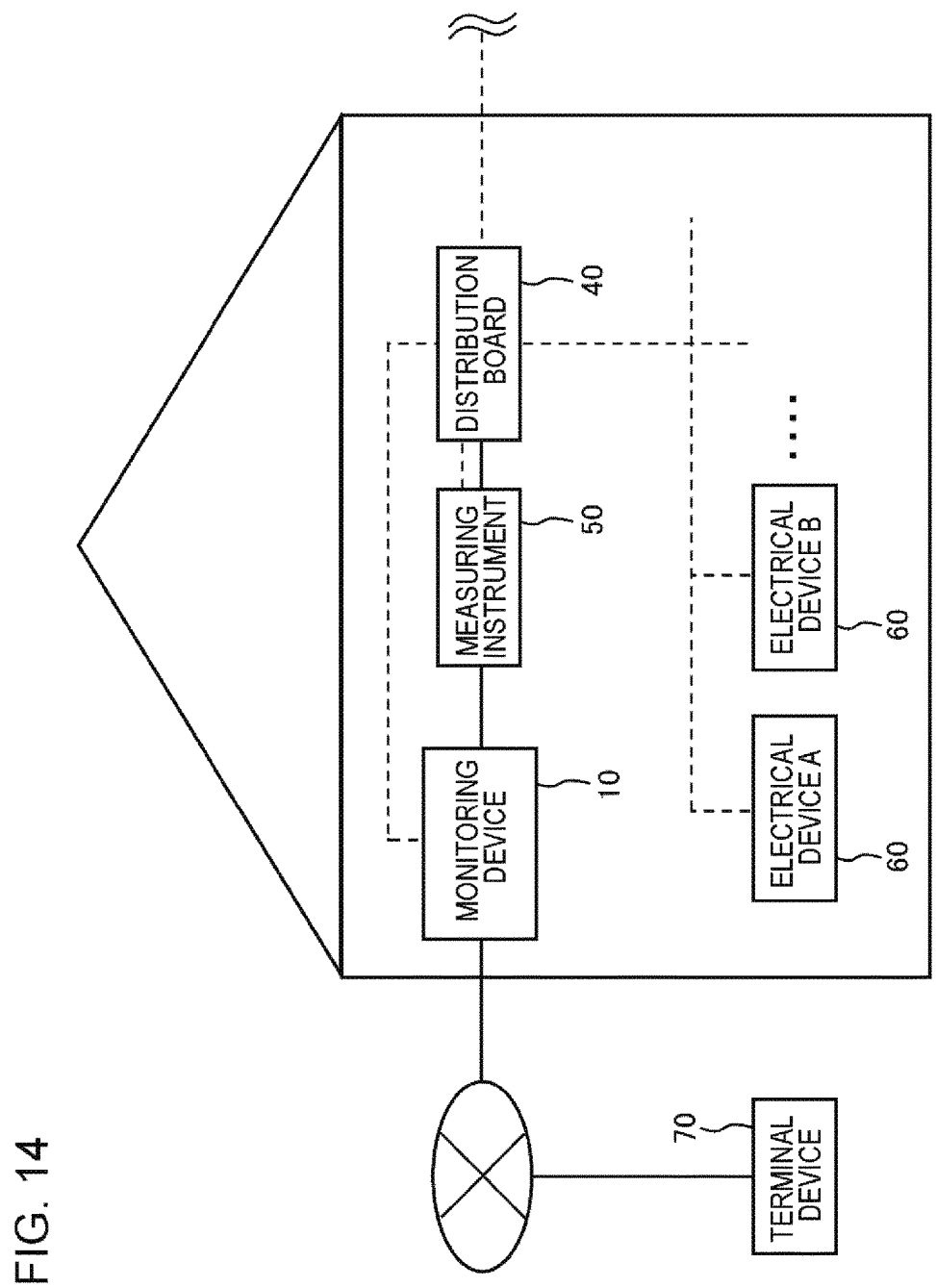
FIG. 14 is a diagram schematically illustrating an example of an application example of the monitoring device according to the present exemplary embodiment.

In the application example illustrated in FIG. 14, the monitoring device 10 is installed in a predetermined unit such as a household, a company, or a building. In the unit, a plurality of electrical devices 60 are installed. Power is supplied to each electrical device 60 through a distribution board 40 installed in the unit. In the drawing, the flow of the power is indicated by a dotted line. The flow of data is indicated by a solid line.

A measuring instrument 50 is installed beside the distribution board 40 to measure current consumption, an input voltage, power consumption, and the like. Measurement data measured by the measuring instrument 50 is transmitted to the monitoring device 10. The monitoring device 10, the distribution board 40, and the measuring instrument 50 are in a state in which data communication is possible through a LAN or a dedicated cable linking the plurality of devices. The monitoring device 10 is connected to a terminal device 70 owned by a user through a network 30 such as the Internet. The electrical device 60 and the monitoring device 10 may be in the state in which data communication with each other is possible although not connected by a data communication line in the drawing. For example, the electrical device 60 may have a function of being connected to a network such as a LAN. The monitoring device 10 supplies the user with the inference result through an output device of the monitoring device 10 or the terminal device 70.

In the case of the application example, predetermined data is stored in the storage unit 11 in the following preliminary preparation.

For example, after the monitoring device 10 is installed in a predetermined unit, the electrical device 60 is individually operated. At this time, the monitoring device 10 receives an input of information identifying the operated electrical device 60 from, for example, the user and acquires each piece of measurement data measured by the measuring instrument 50 as device-specific training waveform data of each monitoring target electrical device. The monitoring device 10 can store the acquired device-specific training waveform data of each monitoring target electrical device in the storage unit 11. The monitoring device 10 can generate the training difference information which is at least one of the foregoing (1) to (3) using the acquired device-specific training waveform data of each monitoring target electrical device and stores the training difference information in the storage unit 11. Further, the monitoring device 10 may generate the sum training difference information using the training difference information and store the sum training difference information in the storage unit 11.

As another example, device-specific training waveform data of each of various diverse electrical devices available in markets, a predetermined training feature amount extracted from the device-specific training waveform data, or the training difference information which is at least one of the foregoing (1) to (3) may be stored in a server (not illustrated) connected to the network 30. The monitoring device 10 acquires information identifying each of the electrical devices 60 installed in the predetermined unit through an input by hand operation of the monitoring device 10, an input through the terminal device 70, or communication with each of the electrical devices 60. Thereafter, the monitoring device 10 may access the server, acquire the device-specific training waveform data, the training feature amount, or the training difference information of each of the identified electrical devices 60, and store the device-specific training waveform data, the training amount, or the training difference information in the storage unit 11. The monitoring device 10 can generate the training difference information which is at least one of the foregoing (1) to (3) using such information and store the training difference information in the storage unit 11. Further, the monitoring device 10 may generate the sum training difference information using the training difference information and store the sum training difference information in the storage unit 11.

The foregoing two examples may be combined as an example. That is, when the monitoring device 10 acquires the information identifying each of the electrical devices 60 installed in the predetermined unit, the monitoring device 10 accesses the server, acquires the training difference information which is at least one of the device-specific training waveform data, the training feature amount, or the foregoing (1) to (3) of each of the identified electrical devices 60, and stores the various kinds of data in the storage unit 11 in the same manner as the foregoing. Then, in a case in which the training difference information which is at least one of the device-specific training waveform data, the training feature amount, or the foregoing (1) to (3) of each of one or more electrical devices 60 may not be acquired through the foregoing process for the reason that the device-specific training waveform data or the training feature amount is not stored in the server, the monitoring device 10 may output information prompting a job of individually operating the unacquirable electrical devices 60 to the user. Then, the monitoring device 10 may acquire the device-specific training waveform data, the training feature amount, or the training difference information which is at least one of the foregoing (1) to (3) as in the above-described unit where the electrical devices 60 are individually operated and store the various kinds of data in the storage unit 11 in the foregoing way.

Through the foregoing preliminary preparation, the above-described inference process is performed by the unit-specific waveform data acquisition unit 12, the first inference unit 13, and the second inference unit 14 after the predetermine data is stored in the storage unit 11.

Figure 15:
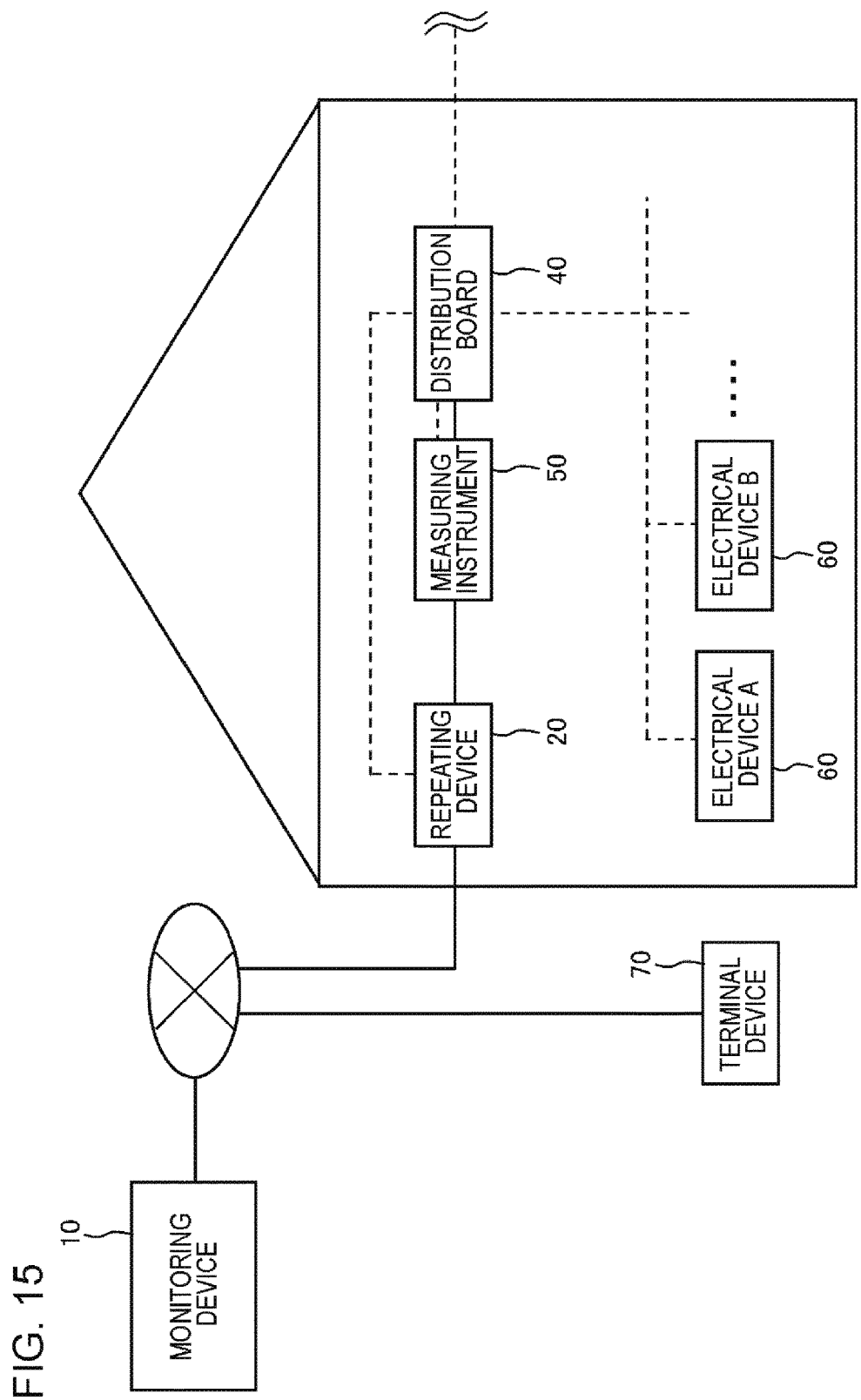
FIG. 15 is a diagram schematically illustrating an example of an application example of the monitoring device according to the present exemplary embodiment.

In the application example illustrated in FIG. 15, a repeating device 20 is installed in a predetermined unit such as a household, a company, or a building. In the unit, a plurality of electrical devices 60 are installed. Power is supplied to each electrical device 60 through a distribution board 40 installed in the unit. In the drawing, the flow of the power is indicated by a dotted line. The flow of data is indicated by a solid line.

A measuring instrument 50 is installed beside the distribution board 40 to measure current consumption, an input voltage, power consumption, and the like. Measurement data measured by the measuring instrument 50 is transmitted to the repeating device 20. The repeating device 20, the distribution board 40, and the measuring instrument 50 are in a state in which data communication is possible through a LAN or a dedicated cable linking the plurality of devices. The repeating device 20 is connected to a terminal device 70 owned by a user through a network 30 such as the Internet. The electrical device 60 and the repeating device 20 may be in the state in which data communication with each other is possible although not connected by a data communication line in the drawing. For example, the electrical device 60 may have a function of being connected to a network such as a LAN.

The monitoring device 10 is installed outside the predetermined unit. The monitoring device 10 may be a so-called cloud server. The monitoring device 10 can perform data communication with the repeating device 20 or the terminal device 70 through a network 30. For example, the monitoring device 10 acquires unit-specific monitoring waveform data through the repeating device 20. The monitoring device 10 supplies the user with the inference result through the repeating device 20 or the terminal device 70.

In the case of the application example, when the repeating device 20 acquires measurement data (the device-specific training waveform data, the unit-specific monitoring waveform data, or the like) from the measuring instrument 50, the repeating device 20 transmits the acquired measurement data to the monitoring device 10. The repeating device 20 may receive an input of information identifying the electrical device 60 corresponding to each of measurement data for generating training data from the user, for example, in the same way as the example illustrated in FIG. 14 and also transmit the identification information of the electrical device 60 corresponding to each piece of measurement data for generating training data along with the measurement data for generating training data to the monitoring device 10. When the repeating device 20 acquires data (the information identifying the electrical devices 60 installed in the unit) from the electrical devices 60 installed in the predetermined unit, the repeating device 20 transmits the acquired data to the monitoring device 10. When the repeating device 20 receives an input of predetermined information (the information identifying the electrical devices 60 installed in the unit, or the like) from the user, the repeating device 20 transmits the acquired information to the monitoring device 10. Even in the application example, predetermined data is stored in the storage unit 11 in the same preprocessing as the application example illustrated in FIG. 14.

<Second Exemplary Embodiment>

Figure 16:
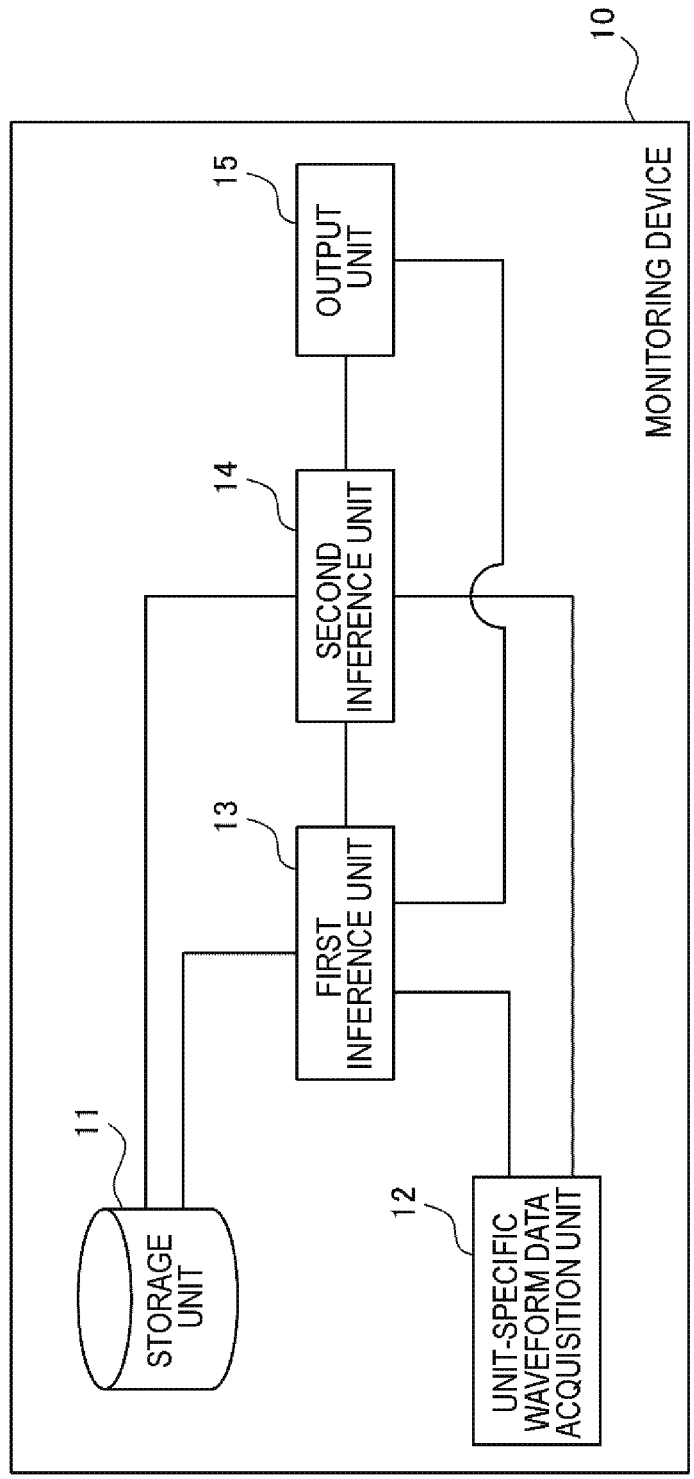
FIG. 16 is an exemplary functional block diagram illustrating the monitoring device according to the present exemplary embodiment.

A present exemplary embodiment is different from the first exemplary embodiment in that an output unit 15 is included. FIG. 16 illustrates an exemplary functional block diagram illustrating a monitoring device 10 according to the present exemplary embodiment. As illustrated, the monitoring device 10 includes a storage unit 11, a unit-specific waveform data acquisition unit 12, a first inference unit 13, a second inference unit 14, and an output unit 15. The configurations of the storage unit 11, the unit-specific waveform data acquisition unit 12, the first inference unit 13, and the second inference unit 14 are the same as those of the first exemplary embodiment. The monitoring device according to the present exemplary embodiment may also be configured not to include the storage unit 11, as in the first exemplary embodiment (see FIG. 26).

The output unit 15 outputs inference results (the power consumption (an instantaneous value or a history of the power consumption in a predetermined period) of each monitoring target electrical device) by the first inference unit 13 and the second inference unit 14. The output unit 15 may output the inference results through an output device such as a display, a printer, or a mailer. In a case in which the mailer is used, address information of a destination to which the inference results are transmitted is registered in advance in the output unit 15. Then, the output unit 15 transmits the inference results to a predetermined transmission destination using predetermined address information.

FIG. 17 illustrates an example of an output example. According to the inference result illustrated in FIG. 17, a user can easily comprehend total power consumption (instantaneous value) at a certain time point in a certain unit and the power consumption (instantaneous value) of each of the monitoring target electrical devices installed in the unit.

According to the present exemplary embodiment, it is possible to realize the other same advantageous effects as those of the first exemplary embodiment.

<Third Exemplary Embodiment>

An overview of a present exemplary embodiment will be described. A monitoring device 10 according to the present exemplary embodiment first infers a power state (operation state) of each monitoring target electrical device at a predetermined timing, that is, one of a power-on state and a power-off state. Then, management information indicating the inferred power state (operation state) of each monitoring target electrical device is retained.

Thereafter, the monitoring device 10 monitors change in the power state (change in the operation state) of the monitoring target electrical device. Then, when the change in the power state (the change in the operation state) of the monitoring target electrical device is detected, the management information is updated based on a detected result. The monitoring target electrical device in the power-on state at the predetermined timing is inferred with reference to the management information.

Thereafter, the monitoring device 10 infers the power consumption of each monitoring target electrical device of which the power state is inferred to be the power-on state using the training feature amount corresponding to each power consumption of each monitoring target electrical device of which the power state is inferred to be the power-on state and the sum training feature amount generated from the training feature amounts. The power consumption of the monitoring target electrical device of which the power state is inferred to be the power-off state can be inferred to be, for example, 0 W.

Next, a configuration according to the present exemplary embodiment will be described in detail. FIGS. 2 and 16 illustrate exemplary functional block diagrams of the monitoring device 10 according to the present exemplary embodiment. As illustrated in FIG. 2, the monitoring device 10 includes the storage unit 11, the unit-specific waveform data acquisition unit 12, the first inference unit 13, and the second inference unit 14. As illustrated in FIG. 16, the monitoring device 10 can further include an output unit 15. The configurations of the unit-specific waveform data acquisition unit 12 and the output unit 15 are the same as those of the first and second exemplary embodiments. The monitoring device according to the present exemplary embodiment may also be configured not to include the storage unit 11, as in the first and second exemplary embodiments (see FIG. 21).

The configuration of the storage unit 11 is also the same as that of the first exemplary embodiment. FIG. 18 schematically illustrates an example of training difference information stored in the storage unit 11 according to the present exemplary embodiment. In the training difference information illustrated in FIG. 18, a training data ID, a device ID, a first operation state, a second operation state, and a feature amount are associated with each other. The training difference information of the training data ID "0001-001" includes the feature amount when the power state of the monitoring target electrical device with the device ID "0001" is changed from a power-off state to a power-on state. The feature amount may be one kind of feature amount or may be a combination of a plurality of kinds of feature amounts.

The storage unit 11 may further store sum training difference information generated by combining the difference information corresponding to the monitoring target electrical devices illustrated in FIG. 18. FIG. 19 schematically illustrates an example of the sum training difference information.

In the sum training difference information illustrated in FIG. 19, the training data ID, the sum training feature amount, and a state are associated with each other. Sum training difference information of a training data ID "(0001-001)+(0002-001)" is generated based on the training difference information of a training data ID "0001-001" and the training difference information of a training data ID "0002-001" illustrated in FIG. 18. The sum training difference information includes a feature amount (sum training feature amount) when the power state of a monitoring target electrical device with a device ID "0001" is changed from the power-off state to the power-on state and a monitoring target electrical device with a device ID "0002" is changed the power-off state to the power-on state.

It is rare that all of the operation states of the plurality of monitoring target electrical devices are simultaneously changed. Therefore, even in the present exemplary embodiment, as in the first exemplary embodiment, it is not necessary to store the sum training difference information corresponding to all of the combinations of the plurality of monitoring target electrical devices in the storage unit 11. Some of the sum training difference information may be stored.

The first inference unit 13 is different from that of the first exemplary embodiment in that the first inference unit 13 infers change in the power states as change in operation states of at least some of the monitoring target electrical devices. The other remaining configuration is the same as that of the first exemplary embodiment.

The first inference unit 13 infers the power state of each monitoring target electrical device at a predetermined timing. Then, the management information (see FIG. 20) indicating inferred results is generated and retained. The change in the power state of the monitoring target electrical device is monitored after the predetermined timing, and when the change is detected, the management information (see FIG. 20) is updated.

As the predetermined timing at which the first inference unit 13 infers the power state of each monitoring target electrical device, a first stage of starting a monitoring process by the monitoring device 10 or a timing of each predetermined time (for example, every 30 minutes, every hour, or every 6 hours) while the monitoring device 10 continues the monitoring process in addition to the first stage is considered.

Here, examples of a process of inferring the power state (the operation state) of each monitoring target electrical device in order for the first inference unit 13 to generate the management information will be described.
<Power State Inference Process 1>

For example, in a state in which the power states of all the monitoring target electrical devices are a power-off state, the monitoring device 10 receives an input indicating the power-off state, for example, from a user. Then, the first inference unit 13 infers that the power states of all the monitoring target electrical devices is the power-off state at the time point of reception of the input. The process is proper for a case in which the process is performed in the first stage of starting the monitoring process by the monitoring device 10.
<Power State Inference Process 2>

As another example, for example, the monitoring device 10 receives an input of information indicating the power state of each monitoring target electrical device at a certain timing (for example, the time point or a certain time of a certain day) from the user at a predetermined timing. The first inference unit 13 infers the power state of each monitoring target electrical device at the timing based on input information.

The first inference unit 13 can realize the process of inferring the change in the power states of the monitoring target electrical devices after the timing at which the power states are inferred using the difference information corresponding to each of the monitoring target electrical devices, as illustrated in FIG. 18, or the sum training difference information generated by combining the difference information, as illustrated in FIG. 19, as in the process of inferring the change in the power consumption of each of the monitoring target electrical devices in the first exemplary embodiment. Accordingly, the description will not be repeated herein.

The first inference unit 13 can infer the power state of each monitoring target electrical device not only at the timings at which the power state of the monitoring target electrical device is inferred in the power state inference processes 1 and 2 but also at other timings with reference to, for example, the management information (see FIG. 20) generated through the power state inference processes 1 and 2 and updated based on the subsequent inference results.

Next, the second inference unit 14 sets only the monitoring target electrical devices of which the power state is inferred to be the power-on state by the first inference unit 13 as processing targets and infers the power consumption of the monitoring target electrical devices. That is, the second inference unit 14 infers the power consumption of each monitoring target electrical device which is the processing target using the training feature amount corresponding to each power consumption of each monitoring target electrical device of which the power state is inferred to be the power-on state by the first inference unit 13 and the sum training feature amount generated from the training feature amounts. The power consumption of the monitoring target electrical device of which the power state is inferred to be the power-off state can be inferred to be, for example, 0 W.

The process by the second inference unit 14 can be realized in the same way (which is different in that only the processing target is different) as "Power Consumption Inference Process 2" described in the first exemplary embodiment. The number of monitoring target electrical devices is less in the present exemplary embodiment than in the first exemplary embodiment. In contrast, an execution frequency of the process is less in the first exemplary embodiment than in the present exemplary embodiment.

Next, an example of the flow of a process of a monitoring method according to the exemplary embodiment will be described with reference to the flowchart of FIG. 21.

The unit-specific waveform data acquisition unit 12 first acquires the unit-specific monitoring waveform data which is waveform data of at least one among the total current consumption, the total input voltage, and the total power consumption in the unit in which the monitoring target electrical devices are installed (S20).

Thereafter, the first inference unit 13 infers the power states of the monitoring target electrical devices at a certain timing and generates the management information (see FIG. 20) (S21).

Next, the first inference unit 13 extracts difference information (first monitoring difference group) configured to include the predetermined kind of feature amount from the unit-specific monitoring waveform data acquired in step S20 (S22). Thereafter, the first inference unit 13 infers whether the power states of the monitoring target electrical devices are changed after the timing at which the power states of the plurality of monitoring target electrical devices are inferred in S21 using the difference information (first monitoring difference group) extracted in S22, and infers the details (which monitoring target electrical devices among the processing targets and how the power states of the monitoring target electric devices are changed) of the change in the case in which the power states are changed (S23).

In a case in which the power states are changed (Yes in S24), the first inference unit 13 updates the management information based on the inference result (S25), and subsequently the process proceeds to S26. Conversely, in a case in which the power states are not changed (No in S24), the process proceeds to S26 without the updating. In S26, the first inference unit 13 infers the power state of each of the plurality of monitoring target electrical devices based on the latest management information. Then, the inference result is input to the second inference unit 14.

Thereafter, the second inference unit 14 sets only the monitoring target electrical devices of which the power state is inferred to be the power-on state as processing targets and infers the power consumption of the monitoring target electrical devices (S27).

In the case of the above-described present exemplary embodiment, the power states of the plurality of monitoring target electrical devices are first inferred (first process). Thereafter, only the monitoring target electrical devices of which the power state is inferred to be the power-on state are set as the processing targets, and the power consumption of each monitoring target electrical device is inferred using the training feature amount corresponding to each power consumption of the monitoring target electrical device which is the processing target and the sum training feature amount generated using the training feature amounts (second process).

Therefore, the training data used in the second process is fewer than in a case in which all of the monitoring target electrical devices are set as the processing targets and the process is performed. As a result, it is possible to reduce a processing load.

The number of pieces of training data (see FIGS. 18 and 19) used to infer the power states which can be only two states, the power-on state and the power-off state, is less than the number of pieces of training data (see FIGS. 18 and 19) used to infer the power consumption (for example, 5 W, 10 W, and 15 W) which can be multiple states.

In the case of the present exemplary embodiment, the change in the power state is detected using the difference information. It is rare that the power states of many monitoring target electrical devices are simultaneously changed. Therefore, it is possible to reduce the number of combinations to be considered, and thus it is possible to reduce the number of pieces of training data.

Accordingly, in the case of the present exemplary embodiment, two processes, the process of inferring the power states and the process of inferring the power consumption, are performed. It is possible to reduce the processing load further than a case in which all of the monitoring target electrical devices are set as the processing targets and the power consumption of each monitoring target electrical device is inferred using the training feature amounts corresponding to each power consumption of each of all the monitoring target electrical device and the sum training feature amounts generated using the training feature amounts.

<Fourth Exemplary Embodiment>

An overview of a present exemplary embodiment will be described. A monitoring device 10 according to the present exemplary embodiment monitors change in power consumption (change in operation states) of monitoring target electrical devices. Thereafter, the power consumption of each monitoring target electrical device is inferred using the training feature amount corresponding to each power consumption of each monitoring target electrical device inferred as having no change in the power consumption (no change in the operation state) and a sum training feature amount generated from the training feature amounts. The operation state of the monitoring target electrical device inferred as having change in the power consumption is inferred as a power consuming state that the changed power is being consumed.

Next, a configuration according to the present exemplary embodiment will be described in detail. FIGS. 2 and 16 illustrate exemplary functional block diagrams of the monitoring device 10 according to the present exemplary embodiment. As illustrated in FIG. 2, the monitoring device 10 includes the storage unit 11, the unit-specific waveform data acquisition unit 12, the first inference unit 13, and the second inference unit 14. As illustrated in FIG. 16, the monitoring device 10 may further include an output unit 15. The configurations of the storage unit 11, the unit-specific waveform data acquisition unit 12, and the output unit 15 are the same as those of the first to third exemplary embodiments. The monitoring device according to the present exemplary embodiment may also be configured not to include the storage unit 11, as in the first to third exemplary embodiments (see FIG. 21).

The first inference unit 13 infers change in the power consumption of the plurality of monitoring target electrical devices between a first timing and a subsequent second timing in the unit-specific monitoring waveform data. The process has been described in the first exemplary embodiment.

The second inference unit 14 sets the monitoring target electrical devices inferred as having no change in the power consumption by the first inference unit 13 as processing targets and infers the power consumption at the second timing. For the monitoring target electrical devices inferred as having change in the power consumption by the first inference unit 13, the inferred power consumption after the change is inferred as power consumption at the second timing.

The process of inferring the power consumption of each monitoring target electrical device which is the processing target at the second timing can be realized by substituting the processing target with the monitoring target electrical device inferred as having no change in the power consumption by the first inference unit 13 in the process of the second inference unit 14 described in the third exemplary embodiment.

For example, the second inference unit 14 can infer the power consumption of the monitoring target electrical device based on the training feature amount corresponding to the power consumption of each monitoring target electrical device which is the processing target, the sum training feature amount generated using the training feature amounts, and feature amounts (feature amounts extracted from the waveform data at the second timing) extracted from the unit-specific monitoring waveform data.

Here, the feature amounts (feature amounts extracted from the waveform data at the second timing) extracted from the unit-specific monitoring waveform data can also include components of the monitoring target electrical devices inferred as having change in the power consumption by the first inference unit 13. Accordingly, the second inference unit 14 infers the power consumption of the other monitoring target electrical devices through a process in which the unit-specific monitoring waveform data is considered to include the components. The components mean components appearing in the unit-specific monitoring waveform data when the monitoring target electrical devices inferred as having change in the power consumption by the first inference unit 13 consume the inferred power after the change.

As the process in which the unit-specific monitoring waveform data is considered to include the components, for example, a process of subtracting the components from the unit-specific monitoring waveform data and a process of subtracting the feature amounts corresponding to the components from the feature amounts extracted from the unit-specific monitoring waveform data are considered. However, the present invention is not limited thereto.

Next, an example of the flow of a process of a monitoring method according to the present exemplary embodiment will be described with reference to the flowchart of FIG. 22.

The unit-specific waveform data acquisition unit 12 first acquires the unit-specific monitoring waveform data which is waveform data of at least one among the total current consumption, the total input voltage, and the total power consumption in a unit in which the monitoring target electrical devices are installed (S30).

Next, the first inference unit 13 extracts the difference information (first monitoring difference group) configured to include the predetermined kind of feature amount from the unit-specific monitoring waveform data acquired in step S30 (S31). Thereafter, the first inference unit 13 infers whether the power consumption of the monitoring target electrical devices is changed using the difference information (first monitoring difference group) extracted in S31 and infers the details (which monitoring target electric devices are changed from which power consumption to which power consumption) of the change when the power consumption is changed (S32).

Thereafter, the second inference unit 14 sets only the monitoring target electrical devices inferred as having no change in the power consumption as the processing targets and infers the power consumption of the monitoring target electrical devices (S33).

In the case of the above-described present exemplary embodiment, the change in the power consumption of the plurality of monitoring target electrical devices is first inferred (first process). Thereafter, only the monitoring target electrical devices inferred as having no change in the power consumption are set as the processing targets, and the power consumption of each monitoring target electrical device is inferred using the training feature amount corresponding to the power consumption of each monitoring target electrical device which is the processing target and the sum training feature amount generated using the training feature amounts (second process).

Therefore, the training data used in the second process is fewer than in a case in which all of the monitoring target electrical devices are set as the processing targets and the process is performed. As a result, it is possible to reduce a processing load.

In the case of the present exemplary embodiment, the change in the power consumption is detected using the difference information. As described above, it is rare that the power consumption of many monitoring target electrical devices is simultaneously changed. Therefore, it is possible to reduce the number of combinations to be considered, and thus it is possible to reduce the number of pieces of training data.

Accordingly, in the case of the present exemplary embodiment, two processes, the process of inferring the change in the power consumption and the process of inferring the power consumption, are performed. It is possible to reduce the processing load further than a case in which all of the monitoring target electrical devices are set as the processing targets and the power consumption of each of all the monitoring target electrical devices is inferred using the training feature amount corresponding to each power consumption of each of all the monitoring target electrical devices and the sum training feature amounts generated using the training feature amounts.

<Fifth Exemplary Embodiment>

An overview of a present exemplary embodiment will be described. A monitoring device 10 according to the present exemplary embodiment monitors change in power states (change in operation states) of monitoring target electrical devices. Thereafter, the monitoring target electrical devices are set as processing targets, excluding the monitoring target electrical devices inferred as having change in the power state and of which the changed state is inferred to be a power-off state, and the power consumption of each monitoring target electrical device is inferred using the training feature amount corresponding to each power consumption of each monitoring target electrical device and the sum training feature amount generated from the training feature amounts. For the monitoring target electrical devices which are not the processing targets, the power consumption can be inferred to be, for example, 0 W.

Next, a configuration according to the present exemplary embodiment will be described in detail. FIGS. 2 and 16 illustrate exemplary functional block diagrams of the monitoring device 10 according to the present exemplary embodiment. As illustrated in FIG. 2, the monitoring device 10 includes the storage unit 11, the unit-specific waveform data acquisition unit 12, the first inference unit 13, and the second inference unit 14. As illustrated in FIG. 16, the monitoring device 10 may further include an output unit 15. The configurations of the storage unit 11, the unit-specific waveform data acquisition unit 12, and the output unit 15 are the same as those of the first to fourth exemplary embodiments. The monitoring device according to the present exemplary embodiment may also be configured not to include the storage unit 11, as in the first to fourth exemplary embodiments (see FIG. 21).

The first inference unit 13 infers the change in the power states of the plurality of monitoring target electrical devices between a first timing and a subsequent second timing in the unit-specific monitoring waveform data. The process has described in the third exemplary embodiment.

The second inference unit 14 sets the monitoring target electrical devices as the processing targets, excluding the monitoring target electrical devices inferred as having change in the power state and of which the changed state is inferred to be the power-off state by the first inference unit 13, and infers the power consumption thereof at the second timing. The power consumption of the monitoring target electrical device which is not the processing targets can be inferred to be, for example, 0 W.

The process of inferring the power consumption of each of the monitoring target electrical devices which are the processing targets at the second timing can be realized by substituting the processing targets with the monitoring target electrical devices, excluding the monitoring target electrical devices inferred as having change in the power state and of which the changed state is inferred to be the power-off state by the first inference unit 13 in the process of the second inference unit 14 described in the third exemplary embodiment.

For example, the second inference unit 14 can infer the power consumption of the monitoring target electrical devices based on the training feature amount corresponding to each power consumption of each monitoring target electrical device which is the processing target, the sum training feature amount generated using the training feature amounts, and the feature amounts (the feature amounts extracted from the waveform data at the second timing) extracted from the unit-specific monitoring waveform data.

Next, an example of the flow of a process of a monitoring method according to the present exemplary embodiment will be described with reference to the flowchart of FIG. 23.

The unit-specific waveform data acquisition unit 12 first acquires the unit-specific monitoring waveform data which is waveform data of at least one among the total current consumption, the total input voltage, and the total power consumption in a unit in which the monitoring target electrical devices are installed (S40).

Next, the first inference unit 13 extracts the difference information (first monitoring difference group) configured to include the predetermined kind of feature amount from the unit-specific monitoring waveform data acquired in step S40 (S41). Thereafter, the first inference unit 13 infers whether the power states of the monitoring target electrical devices are changed using the difference information (first monitoring difference group) extracted in S42 and infers the details (which monitoring target electrical devices among the processing targets and how the power states of the monitoring target electric devices are changed) of the change when the power consumption is changed (S42).

Thereafter, the second inference unit 14 sets only the monitoring target electrical devices as the processing targets, excluding the monitoring target electrical devices inferred as having change in the power state is estimated by the first estimation unit 13 and of which the changed state is inferred to be the power-off state by the first inference unit 13, and infers the power consumption of the monitoring target electrical devices (S43).

In the case of the above-described present exemplary embodiment, change in the power states of the plurality of monitoring target electrical devices is first inferred (first process). Thereafter, only the monitoring target electrical devices excluding the monitoring target electrical devices inferred as having change in the power state and of which the changed state is inferred to be the power-off state are set as the processing targets, and the power consumption of each monitoring target electrical device is inferred using the training feature amount corresponding to each power consumption of each monitoring target electrical device which is the processing target and the sum training feature amount generated using the training feature amounts (second process).

Therefore, the training data used in the second process is fewer than in a case in which all of the monitoring target electrical devices are set as the processing targets and the process is performed. As a result, it is possible to reduce a processing load.

In the case of the present exemplary embodiment, the change in the power state is detected using the difference information. As described above, it is rare that the power states of many monitoring target electrical devices are simultaneously changed. Therefore, it is possible to reduce the number of combinations to be considered, and thus it is possible to reduce the number of pieces of training data.

Accordingly, in the case of the present exemplary embodiment, two processes, the process of inferring the change in the power state and the process of inferring the power consumption, are performed. It is possible to reduce the processing load further than a case in which all of the monitoring target electrical devices are set as the processing targets and the power consumption of each monitoring target electrical device is inferred using the training feature amount corresponding to each power consumption of each of all the monitoring target electrical devices and the sum training feature amount generated using the training feature amounts.

A modification example can also be achieved by combining the fourth exemplary embodiment and the present exemplary embodiment. That is, the monitoring device 10 monitors both of the change in the power states and the change in the power consumption of the monitoring target electrical devices. Thereafter, the monitoring target electrical devices are set as the processing targets, excluding both of the monitoring target electrical devices inferred as having change in the power consumption, and the monitoring target electrical devices inferred as having change in the power state and of which the changed state is inferred to be power-off state, and the power consumption of each monitoring target electrical device is inferred using the training feature amount corresponding to each power consumption of each monitoring target electrical device and the sum training feature amount generated using the training feature amounts. In the modification example, it is possible to realize the same operational effects as those of the exemplary embodiments.

<Sixth Exemplary Embodiment>

In a present exemplary embodiment, the monitoring of the change in the operation states (the change in the power state and the change in the power consumption) using the difference information in the first to fifth exemplary embodiments is divided into a plurality of steps to be performed.

The present inventors have found that some of various feature amounts extracted from the unit-specific monitoring waveform data are unique to specific monitoring target electrical devices. That is, some of the feature amounts extracted from the unit-specific monitoring waveform data include only components of some of the monitoring target electrical devices and does not include components of the other monitoring target electrical devices.

In the present exemplary embodiment, the change in the operation states of some of the monitoring target electrical devices is inferred using such training difference information configured to include feature amounts unique to some of the monitoring target electrical devices (first step), and subsequently the change in the operation states of the other monitoring target electrical devices is inferred using the training difference information configured to include other feature amounts (second step). The feature amounts used in the second step can include the components of the monitoring target electrical devices which are the processing targets in the first step. Therefore, in a case in which the change in the operation states of some of the monitoring target electrical devices is inferred in the first step, in the second step, the change in the operation states of the other monitoring target electrical devices is inferred in consideration of the change in the operation states of some of the monitoring target electrical devices inferred in the first step (for example, by subtracting the change of that extent).

In the case of the present exemplary embodiment, in the first step, the change in the operation states of some of the monitoring target electrical devices can be inferred using only the training difference information of some of the monitoring target electrical devices and the sum training difference information thereof. Since the feature amounts configured to include the training difference information treated in the first step do not include the components of the other monitoring target electrical devices, it is not necessary to set the other monitoring target electrical device as the processing targets in the step.

In the second step, the power consumption of the other monitoring target electrical devices can be inferred using only the training difference information of the other monitoring target electrical devices and the sum training difference information thereof, excluding the monitoring target electrical devices which are the processing targets in the first step.

For example, in a case in which the number of monitoring target electrical devices is 5, the number of combinations is 31 ($=_5C_5+_5C_4+_5C_3+_5C_2+_5C_1$). On the other hand, in a case in which 5 monitoring target electrical devices are divided into a group of 3 monitoring target electrical devices and a group of 2 monitoring target electrical devices, the number of combinations of the groups is 7 ($=_3C_3+_3C_2+_3C_1$) and 3 ($=_2C_2+_2C_1$), and a total number is 10. In the latter case, since it is not necessary to consider combinations of the monitoring target electrical devices included in the first group and the monitoring target electrical devices included in the second group, the total number of combinations is decreased by a number of combinations not required to be considered.

According to the present exemplary embodiment, it is possible to reduce the number of pieces of training difference information (including the sum training difference information) used to monitor the change in the operation states of the monitoring target electrical devices using the training difference information.

Figure 24:
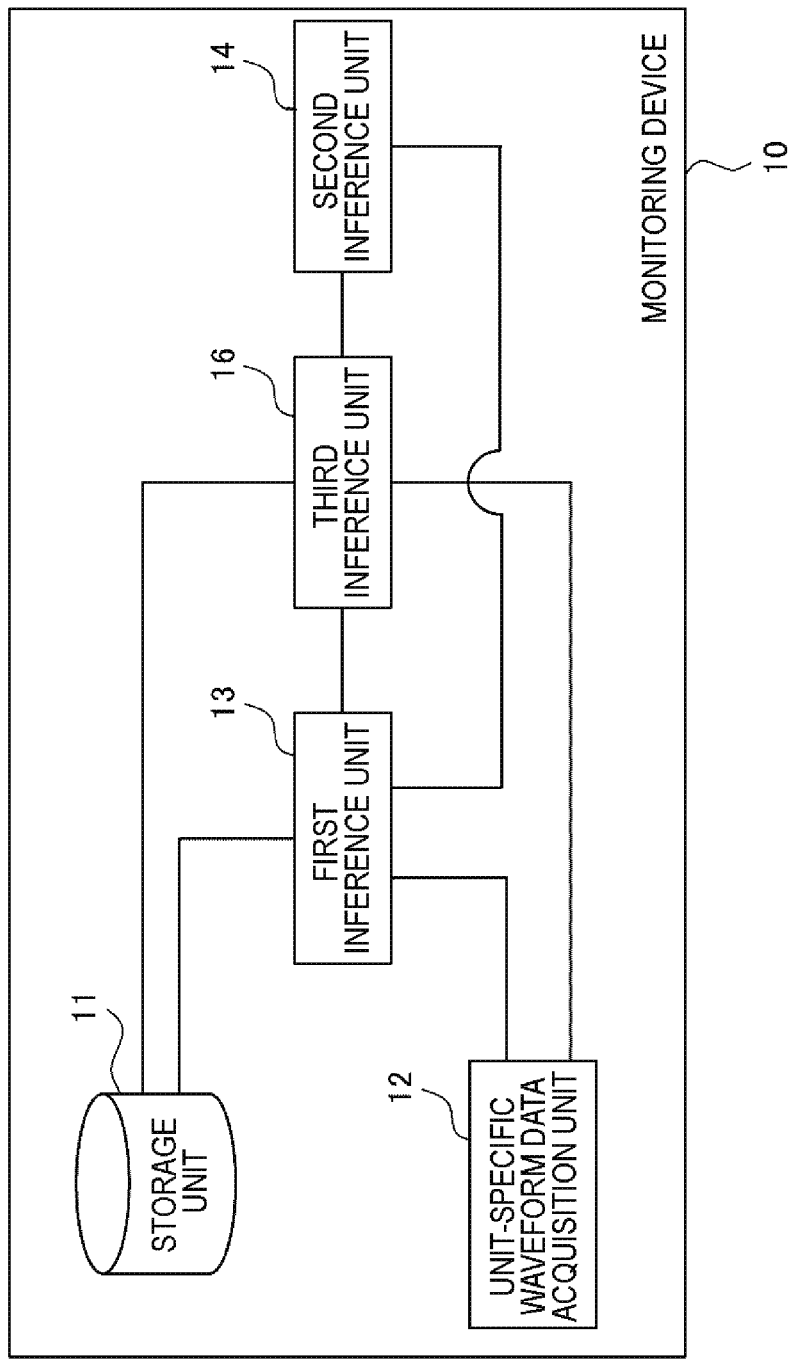
FIG. 24 is an exemplary functional block diagram illustrating the monitoring device according to the present exemplary embodiment.

FIG. 24 illustrates an exemplary functional block diagram of the monitoring device 10 according to the present exemplary embodiment. As illustrated, the monitoring device 10 according to the exemplary embodiment includes the storage unit 11, the unit-specific waveform data acquisition unit 12, the first inference unit 13, the second inference unit 14, and a third inference unit 16. The monitoring device 10 may further include an output unit 15. The configurations of the storage unit 11, the unit-specific waveform data acquisition unit 12, the second inference unit 14, and the output unit 15 are the same as those of the first to fifth exemplary embodiments. The monitoring device according to the present exemplary embodiment may also be configured not to include the storage unit 11, as in the first to fifth exemplary embodiments (see FIG. 21).

The first inference unit 13 infers the change in the operation states (at least one of the change in the power state and the change in the power consumption) of some of the monitoring target electrical devices based on the difference information (first monitoring difference group) configured to include specific kind of feature amount extracted from the unit-specific monitoring waveform data.

As described above, some of various feature amounts extracted from the unit-specific monitoring waveform data are unique to specific monitoring target electrical devices.

That is, the difference information configured to include the kind of feature amount extracted from unit-specific monitoring waveform data does not include the components of the other monitoring target electrical devices. Therefore, the first inference unit 13 infers the change in the operation states (at least one of the change in the power state and the change in the power consumption) of some of the monitoring target electrical devices based on the training difference information of some of the monitoring target electrical devices configured to include the specific kind of feature amount, the sum training difference information obtained by summing the training difference information, and the difference information (the first monitoring difference group) configured to include the kind of the feature amount extracted from the unit-specific monitoring waveform data.

Figure 25:
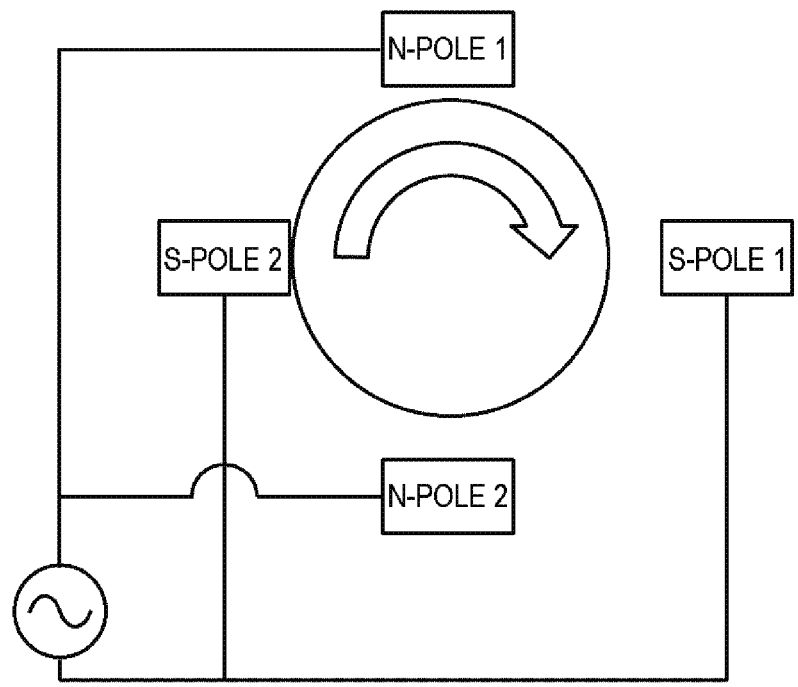
FIG. 25 is a diagram illustrating an example of a monitoring target electrical device of which power consumption is inferred by a first inference unit.

For example, a monitoring target electrical device including a single phase motor that has the n-pole corresponds to such a monitoring target electrical device. FIG. 25 illustrates an example of a motor that has 4 poles. In the case of the motor, ½ rotation is performed at one period. In a case of a monitor that has 6 poles, ⅓ rotation is performed at one period.

In the motor, in a case in which there is a difference between characteristics (speed, force, and the like) at the time of ½ rotation and characteristics (speed, force, and the like) at the time of remaining ½ rotation, a component of a frequency (25 Hz in the case of Eastern Japan and 30 Hz in the case of Western Japan) corresponding to ½ period occurs in the waveform data. In the case of the other monitoring target electrical devices, the component does not occur in the waveform data. Therefore, in the case of the example, the training difference information generated based on the feature amount originated from the component of the frequency (25 Hz in the case of Eastern Japan and 30 Hz in the case of Western Japan) corresponding to ½ period can be set as the first monitoring difference group.

The first inference unit 13 may infer the change in the operation states (at least one of the change in the power state and the change in the power consumption) of some of the monitoring target electrical devices based on some (first-1st monitoring difference group) among the first monitoring difference group and may infer the change in the operation states (at least one of the change in the power state and the change in the power consumption) of other some of the monitoring target electrical devices based on the other (first-2nd monitoring difference group) of the first monitoring difference group.

For example, the first-1st monitoring difference group may be configured with the feature amounts originated from the components of the frequency (25 Hz in the case of Eastern Japan and 30 Hz in the case of Western Japan) corresponding to ½ period and the first-2nd monitoring difference group may be configured with the feature amounts originated from the components of the frequency (about 17 Hz in the case of Eastern Japan and 20 Hz in the case of Western Japan) corresponding to ⅓ period. Here, the example in which the first monitoring difference group is divided into two groups has been described, but may be divided into more groups.

The third inference unit 16 infers the change in the operation states (at least one of the change in the power state and the change in the power consumption) of some of the monitoring target electrical devices based on the monitoring difference group (second monitoring difference group) configured with different kind of feature amount from the feature amount of the first monitoring difference group.

The third inference unit 16 infers the change in the operation states (at least one of the change in the power state and the change in the power consumption) of at least some of the monitoring target electrical devices excluding the monitoring target electrical devices of which the change in the operation states (at least one of the change in the power state and the change in the power consumption) is inferred (set as the processing targets) by the first inference unit 13.

For example, the third inference unit 16 can infer the change in the power states of at least some of the monitoring target electrical devices between the power-on state and the power-off state, excluding the monitoring target electrical devices of which the change in the power state is inferred by the first inference unit 13 or can infer the change in the power consumption.

For example, the third inference unit 16 can infer the change in the power states of at least some of the monitoring target electrical devices between the power-on state and the power-off state, excluding the monitoring target electrical devices of which the change in the power consumption is inferred by the first inference unit 13 or can infer the change in the power consumption.

The inference process by the third inference unit 16 can be realized as in the inference process by the first inference unit 13.

Incidentally, the feature amounts of the second monitoring difference group can also include the components of the monitoring target electrical devices of which the change in the operation states (at least one of the change in the power state and the change in the power consumption) is inferred by the first inference unit 13. Accordingly, the third inference unit 16 infers the change in the operation states (at least one of the change in the power state and the change in the power consumption) of the other monitoring target electrical devices through the process in which the components are considered to be included in the second monitoring difference group. The components mean components indicated in the unit-specific monitoring waveform data when the monitoring target electrical devices of which the change in the operation states (at least one of the change in the power state and the change in the power consumption) is inferred by the first inference unit 13 performs the change in the inferred operation states (at least one of the change in the power state and the change in the power consumption).

As the process in which the unit-specific monitoring waveform data is considered to include the components, for example, a process of subtracting the components from the unit-specific monitoring waveform data and a process of subtracting the feature amounts corresponding to the components from the feature amounts extracted from the unit-specific monitoring waveform data are considered. However, the present invention is not limited thereto.

Figure 13:
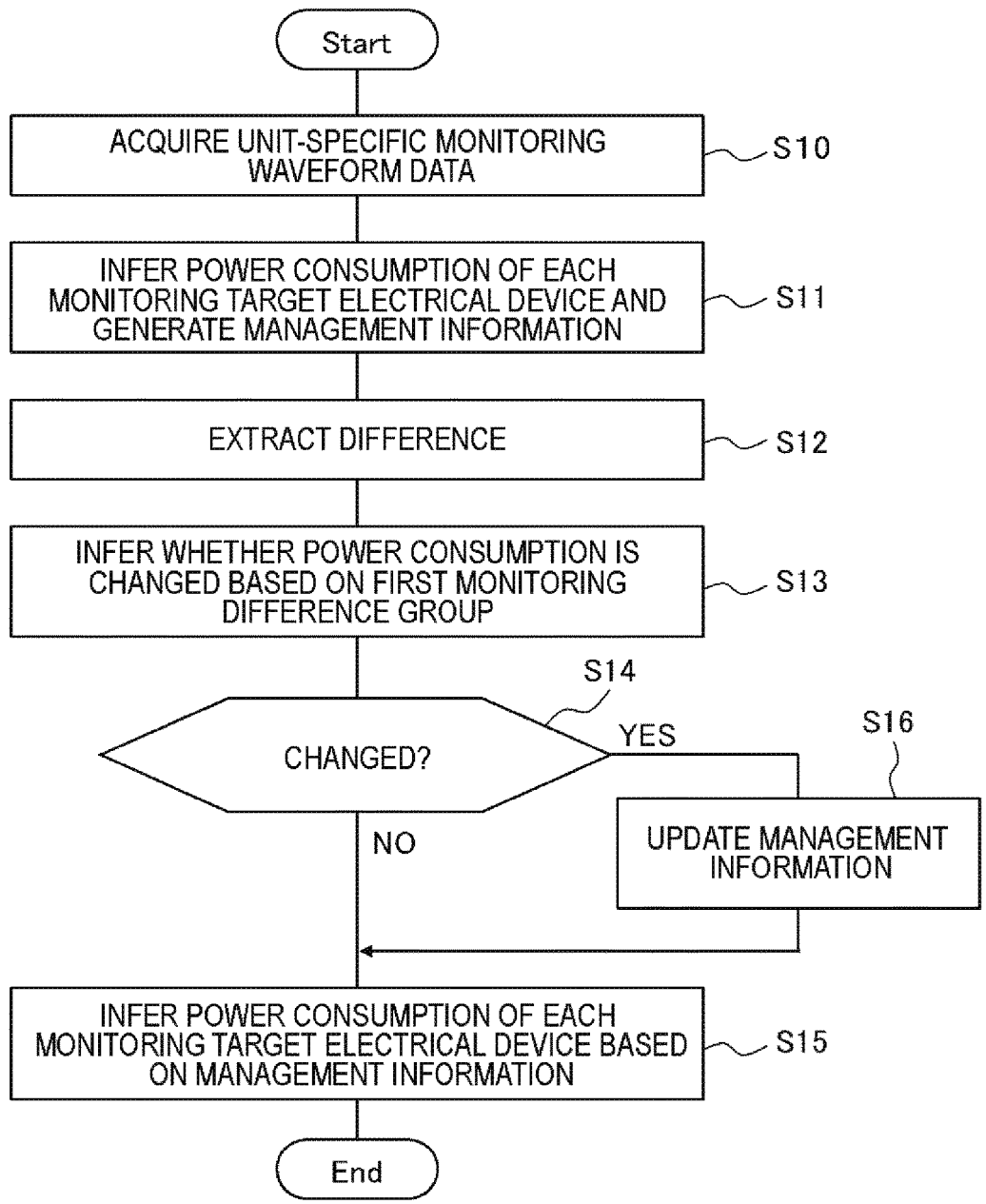
FIG. 13 is a flowchart illustrating an example of the flow of a process of the monitoring device according to the present exemplary embodiment.
Figure 21:
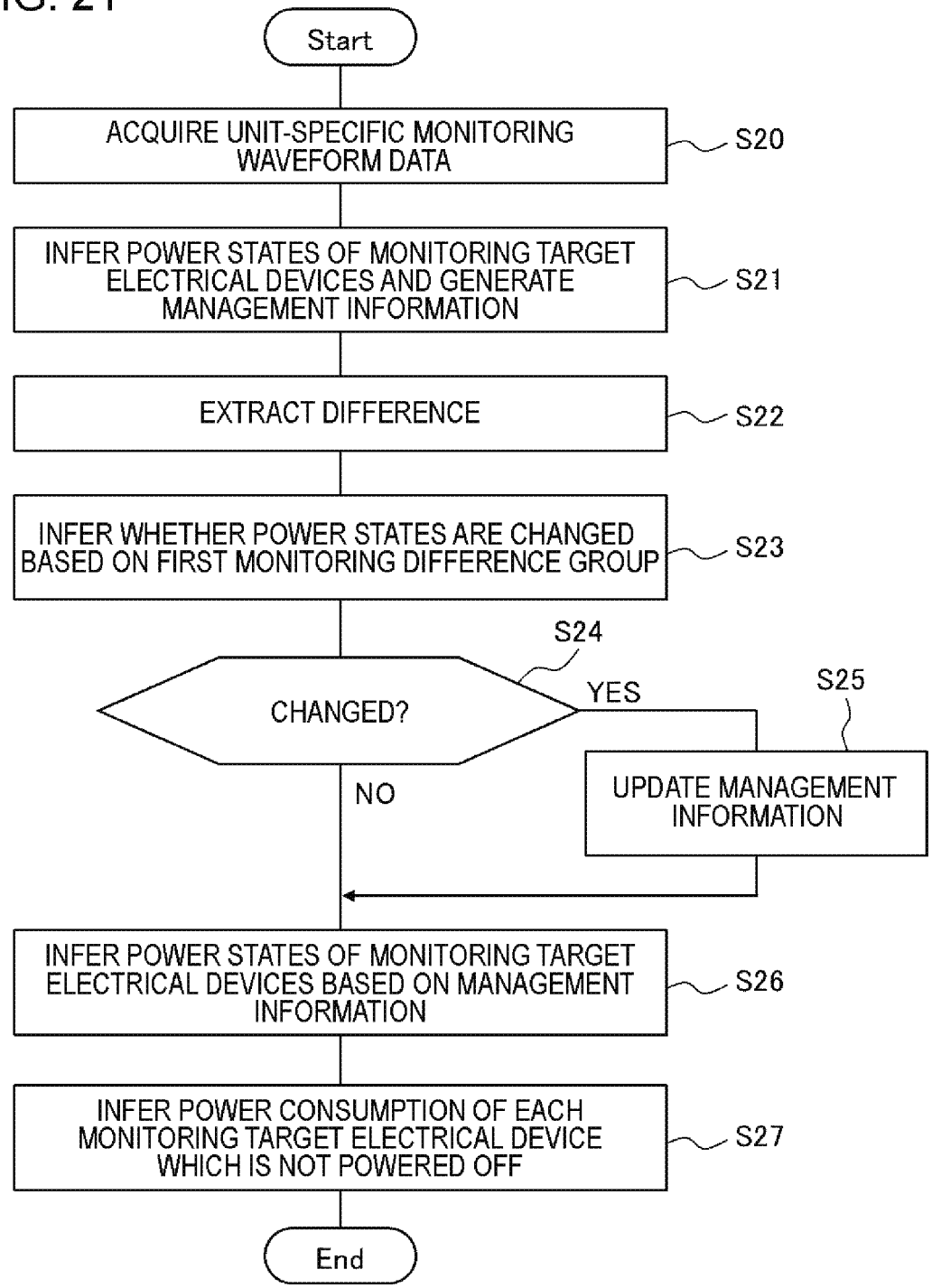
FIG. 21 is a flowchart illustrating an example of the flow of a process of the monitoring device according to the present exemplary embodiment.
Figure 22:
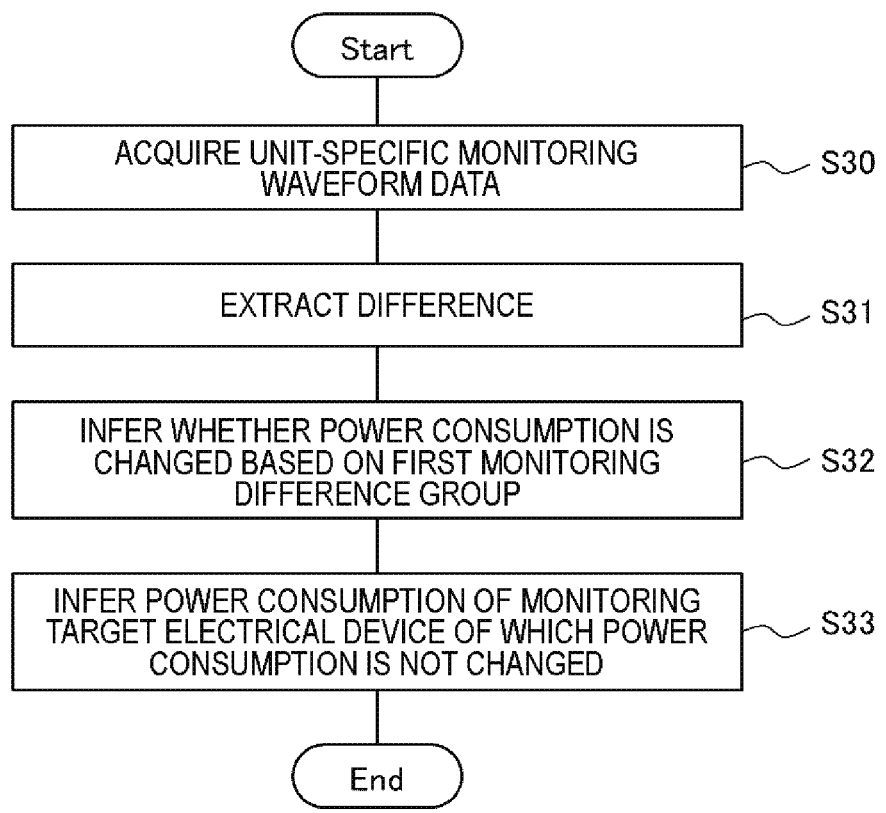
FIG. 22 is a flowchart illustrating an example of the flow of a process of the monitoring device according to the present exemplary embodiment.
Figure 23:
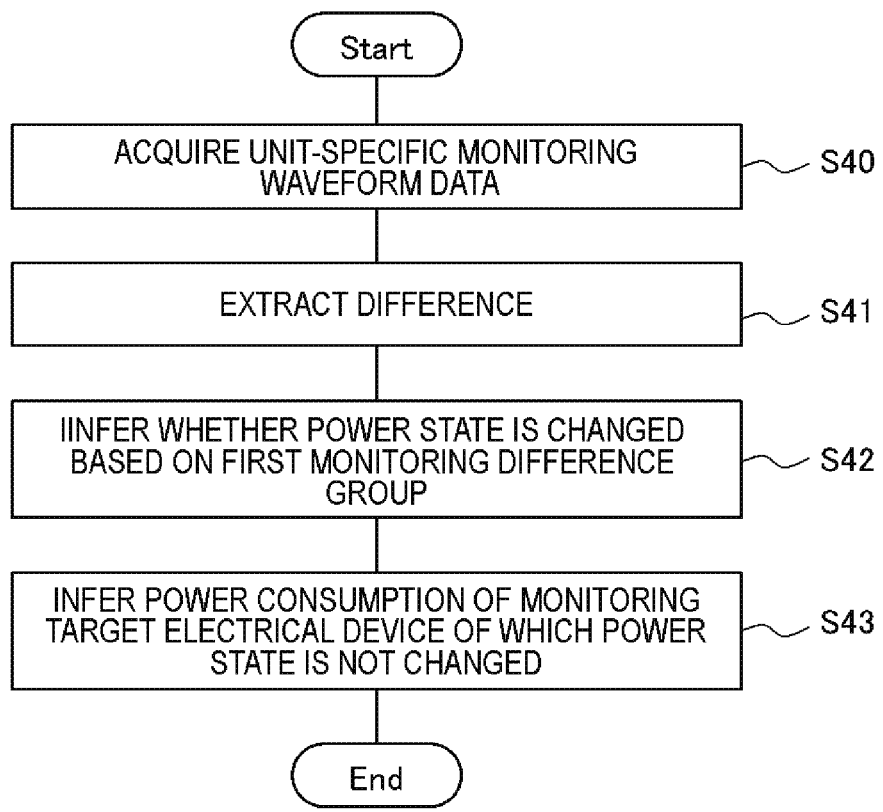
FIG. 23 is a flowchart illustrating an example of the flow of a process of the monitoring device according to the present exemplary embodiment.

In the case of the present exemplary embodiment, S13 of FIG. 13, S23 of FIG. 21, S32 of FIG. 22, and S42 of FIG. 23 are divided into the process by the first inference unit 13 and the process by the third inference unit 16 to be performed in the flow of the process according to the first and fifth exemplary embodiments.

In a case in which the configuration according to the present exemplary embodiment is applied to the first exemplary embodiment or the like, the second inference unit 14 further updates the management information based on the change in the operation states of the monitoring target electrical devices inferred by the third inference unit 16 after a predetermined timing (after a timing at which the management information is generated).

According to the above-described present exemplary embodiment, it is possible to obtain the same advantageous effects as those of the first to fifth exemplary embodiments. By dividing the process of inferring the change in the operation states (at least one of the change in the power state and the change in the power consumption) of the monitoring target electrical devices in the above-described way, it is possible to reduce the number of pieces of training data (the training difference information and the sum training difference information) used in the process.

<Seventh Exemplary Embodiment>

An exemplary functional block diagram of the monitoring device 10 according to the present exemplary embodiment is the same as those of FIGS. 2, 16, and 24. The configurations of the storage unit 11, the unit-specific waveform data acquisition unit 12, and the output unit 15 are the same as those of the first to sixth exemplary embodiments. The monitoring device according to the present exemplary embodiment can also be configured not to include the storage unit 11, as in the first to sixth exemplary embodiments (see FIG. 21).

At least one of the first inference unit 13 and the third inference unit 16 may not obtain the inference result by generating the inference model using the training data and inputting predetermined feature amounts extracted from the unit-specific monitoring waveform data into the generated inference model, but may specify the training feature amounts (including the sum training feature amounts) matching the predetermined feature amounts extracted from the unit-specific monitoring waveform data by sequentially collating the predetermined feature amounts extracted from the unit-specific monitoring waveform data with the training feature amounts (including the sum training feature amounts) included in the training difference information (including the sum training difference information).

For example, at least one of the first inference unit 13 and the third inference unit 16 performs the process of generating the sum training feature amounts and a collation process in parallel. That is, when one sum training feature amount is generated, the collation process is performed. In a case in which the sum training feature amount is not matched, other sum training feature mounts are generated. Then, when the sum training feature amounts matching predetermined feature amounts extracted from the unit-specific monitoring waveform data are found, the process of generating the sum training feature amounts and the collation process accordingly end. The other remaining configurations of the first inference unit 13 and the third inference unit 16 are the same as those of the first to sixth exemplary embodiments.

The second inference unit 14 may not obtain the inference result by generating the inference model using the training data and inputting predetermined feature amounts extracted from the unit-specific monitoring waveform data into the generated inference model, and can specify the training feature amounts (including the sum training feature amounts) matching the predetermined feature amounts extracted from the unit-specific monitoring waveform data by sequentially collating the predetermined feature amounts extracted from the unit-specific monitoring waveform data with the training feature amounts (including the sum training feature amounts) included in the training data.

For example, the second inference unit 14 performs the process of generating the sum training feature amounts and the collation process in parallel. That is, when one sum training feature amount is generated, the collation process is performed. In a case in which the sum training feature amount is not matched, other sum training feature mounts are generated. Then, when the sum training feature amounts matching predetermined feature amounts extracted from the unit-specific monitoring waveform data are found, the process of generating the sum training feature amounts and the collation process accordingly end. The other remaining configuration of the second inference unit 14 is the same as those of the first to sixth exemplary embodiments.

According to the present exemplary embodiment, it is possible to realize the same operational effects as those of the first to sixth exemplary embodiments.

Here, examples of services achieved based on a result inferred by the monitoring device 10 according to the first to seventh exemplary embodiments will be described.

For example, it is possible to give an advice for power saving. In the monitoring device 10 according to the first to seventh exemplary embodiments, it is possible to ascertain a temporal change of the operation states of the electrical devices in a day (from 00:00 to 24:00). Based on such an output, it is possible to specify a time period in which the electrical devices are used a lot and give an advice of intentionally reducing the use of the electrical devices during the time period.

As another example, it is possible to give a notification of a timing of maintenance of an electrical device (for example, cleaning of an air-conditioner). In the monitoring device 10 according to the first to seventh exemplary embodiments, it is possible to calculate an accumulated operation time of each electrical device by accumulating inference results. For example, it is possible to give a notification to request maintenance at a timing at which an accumulative time becomes a predetermined value. A consumed current, a consumed power, a voltage, a measurement feature amount, and the like can be changed due to breakdown of an electrical device or deterioration of some components over time. Accordingly, for example, it is possible to give a notification to give a request for maintenance when such change is detected.

As still another example, it is possible to give an advice on use of a refrigerator. According to a loading state inside the refrigerator, a consumed current, a consumed power, a voltage, a measurement feature amount, and the like can be changed. In the monitoring device 10 according to the first to seventh exemplary embodiments, such change can be detected. Based on the change, a warning against overstuffing or a request for increasing storage since objects are few inside can be notified of.

As still another example, in the monitoring device 10 according to the first to seventh exemplary embodiments, in comparison to a history of previous inference results, it is possible to detect whether a use pattern of electrical devices is different from at the normal time. In a case in which the user pattern of the electrical devices is different, there is a possibility of a certain change (for example, service receivers are sick or involved in incidents) occurring in service receivers (users of the electronic devices). Accordingly, in such a case, a contact destination registered in advance can be notified of the warning.

As still another example, in the monitoring device 10 according to the first to seventh exemplary embodiments, a life rhythm or the like of a user can be inferred based on a use pattern of electronic devices (for example, a use pattern in a day). Accordingly, a warning of improving the life rhythm can be given to a user of an irregular life rhythm (for example, activities are considerable in the night (use of many electronic devices in the night) and day activities and night activities irregularly occur).

Hereinafter, examples of reference configurations will be appended.

1. A monitoring device including:
a unit-specific waveform data acquisition unit that acquires unit-specific monitoring waveform data which is waveform data of at least one among total current consumption, a total input voltage, and total power consumption in a unit in which monitoring target electrical devices are installed;
a first inference unit that infers change in operation states of at least some of the monitoring target electrical devices based on a first monitoring difference group including at least one of at least one kind of feature amount extracted from waveform data of a difference between waveform data of a first timing and waveform data of a second timing in the unit-specific monitoring waveform data, and at least one kind of difference in feature amounts extracted from the waveform data of the first timing and the waveform data of the second timing, and training difference information regarding a difference between a first operation state and a second operation state of each of the monitoring target electrical devices; and
a second inference unit that infers an operation state of each of the monitoring target electrical devices based on an inference result of the first inference unit.

2. The monitoring device described in 1, further including:
a storage unit that stores the training difference information which is at least one among waveform data of a difference between waveform data of at least one among current consumption, an input voltage, and power consumption in the first operation state and the waveform data in the second operation state, at least one kind of feature amount extracted from the waveform data of the difference, and at least one kind of difference in feature amounts extracted from the waveform data in the first operation state and the waveform data in the second operation state, in association with each of the monitoring target electrical devices.

3. The monitoring device described in 1 or 2, further including:
a third inference unit that infers change in operation states of at least some of the monitoring target electrical devices based on a second monitoring difference group which is different from the first monitoring difference group and includes at least one of at least one kind of feature amount extracted from the waveform data of the difference between the waveform data of the first timing and the waveform data of the second timing in the unit-specific monitoring waveform data, and at least one kind of difference in feature amounts extracted from the waveform data of the first timing and the waveform data of the second timing, and the training difference information.

4. The monitoring device described in 3,
wherein the first inference unit infers change in power states of at least some monitoring target electrical devices among the monitoring target electrical devices between a power-on state and a power-off state, and
wherein the third inference unit infers change in a power state between the power-on state and the power-off state or change in power consumption of each of at least some of the monitoring target electrical devices, excluding the monitoring target electrical devices of which the change in the power states is inferred by the first inference unit.

5. The monitoring device described in 3,
wherein the first inference unit infers change in power consumption of each of some of the monitoring target electrical devices, and wherein the third inference unit infers change in a power state between the power-on state and the power-off state or change in power consumption of each of at least some of the monitoring target electrical devices, excluding the monitoring target electrical devices of which the change in the power consumption is inferred by the first inference unit.

6. The monitoring device described in anyone of 1 to 5, wherein the second inference unit retains management information indicating an operation state of each of the monitoring target electrical devices at a predetermined timing and updates the management information based on the change in the operation states of the monitoring target electrical devices inferred by the first inference unit after the predetermined timing.

7. The monitoring device described in 6 dependent on 3, wherein the second inference unit further updates the management information based on the change in the operation states of the monitoring target electrical devices inferred by the third inference unit after the predetermined timing.

8. The monitoring device described in anyone of 2 and 3 to 7 dependent on 2, wherein the storage unit stores at least one of device-specific training waveform data which is waveform data at least one among the current consumption, the input voltage, and the power consumption, and a training feature amount in a predetermined operation state extracted from the device-specific training waveform data, in association with each of the monitoring target electrical devices, and wherein the second inference unit infers the operation states of at least some of the monitoring target electrical devices inferred as having no change in the operation states by the first inference unit based on a feature amount extracted from the unit-specific monitoring waveform data and the training feature amount extracted from the device-specific training waveform data.

9. The monitoring device described in any one of 1 to 8, further including:
an output unit that outputs an inference result.

10. A program causing a computer to function as:
a unit-specific waveform data acquisition unit that acquires unit-specific monitoring waveform data which is waveform data of at least one among total current consumption, a total input voltage, and total power consumption in a unit in which monitoring target electrical devices are installed;
a first inference unit that infers change in operation states of at least some of the monitoring target electrical devices based on a first monitoring difference group including at least one among at least one kind of feature amount extracted from waveform data of a difference between waveform data of a first timing and waveform data of a second timing in the unit-specific monitoring waveform data, and at least one kind of difference in feature amounts extracted from the waveform data of the first timing and the waveform data of the second timing, and training difference information regarding a difference between a first operation state and a second operation state of each of the monitoring target electrical devices; and
a second inference unit that infers an operation state of each of the monitoring target electrical devices based on an inference result of the first inference unit.

10-2. The program described in 1, the program causing the computer to function as:
a storage unit that stores the training difference information which is at least one among waveform data of a difference between waveform data of at least one among current consumption, an input voltage, and power consumption in the first operation state and the waveform data in the second operation state, at least one kind of feature amount extracted from the waveform data of the difference, and at least one kind of difference in feature amounts extracted from the waveform data in the first operation state and the waveform data in the second operation state, in association with each of the monitoring target electrical devices.

10-3. The program described in 10 or 10-2, the program causing the computer to function as:
a third inference unit that infers change in operation states of at least some of the monitoring target electrical devices based on a second monitoring difference group which is different from the first monitoring difference group and includes at least one of at least one kind of feature amount extracted from the waveform data of the difference between the waveform data of the first timing and the waveform data of the second timing in the unit-specific monitoring waveform data, and at least one kind of difference in feature amounts extracted from the waveform data of the first timing and the waveform data of the second timing, and the training difference information.

10-4. The program described in 10-3:
wherein the first inference unit is caused to infer change in power states of at least some monitoring target electrical devices among the monitoring target electrical devices between a power-on state and a power-off state, and
wherein the third inference unit is caused to infer change in a power state between the power-on state and the power-off state or change in power consumption of each of at least some of the monitoring target electrical devices, excluding the monitoring target electrical devices of which the change in the power states is inferred by the first inference unit.

10-5. The program described in 10-3:
wherein the first inference unit is caused to infer change in power consumption of each of some of the monitoring target electrical devices, and
wherein the third inference unit is caused to infer change in a power state between the power-on state and the power-off state or change in power consumption of each of at least some of the monitoring target electrical devices, excluding the monitoring target electrical devices of which the change in the power consumption is inferred by the first inference unit.

10-6. The program described in any one of 10 to 10-5:
wherein the second inference unit is caused to retain management information indicating an operation state of each of the monitoring target electrical devices at a predetermined timing and is caused to update the management information based on the change in the operation states of the monitoring target electrical devices inferred by the first inference unit after the predetermined timing.

10-7. The program described in 10-6 dependent on 10-3:
wherein the second inference unit is caused to further update the management information based on the change in the operation states of the monitoring target electrical devices inferred by the third inference unit after the predetermined timing.

10-8. The program described in any one of 10-2 and 10-3 to 10-7 dependent on 10-2:
wherein the storage unit is caused to store at least one of device-specific training waveform data which is waveform data of at least one among the current consumption, the input voltage, and the power consumption, and a training feature amount in a predetermined operation state extracted from the device-specific training waveform data, in association with each of the monitoring target electrical devices, and wherein the second inference unit is caused to infer the operation states of at least some of the monitoring target electrical devices inferred as having no change in the operation states by the first inference unit based on a feature amount extracted from the unit-specific monitoring waveform data, and the training feature amount extracted from the device-specific training waveform data.

10-9. The program described in any one of 10 to 10-8, the program causing the computer to function as:

an output unit that outputs an inference result.

11. A monitoring method performed by a computer, the method including:

a unit-specific waveform data acquisition step of acquiring unit-specific monitoring waveform data which is waveform data of at least one among total current consumption, a total input voltage, and total power consumption in a unit in which monitoring target electrical devices are installed;

a first inference step of inferring change in operation states of at least some of the monitoring target electrical devices based on a first monitoring difference group including at least one among at least one kind of feature amount extracted from waveform data of a difference between waveform data of a first timing and waveform data of a second timing in the unit-specific monitoring waveform data, and at least one kind of difference in feature amounts extracted from the waveform data of the first timing and the waveform data of the second timing, and training difference information regarding a difference between a first operation state and a second operation state of each of the monitoring target electrical devices; and a second inference step of inferring an operation state of each of the monitoring target electrical devices based on an inference result of the first inference unit.

11-2. The monitoring method described in 11, the method performed by the computer, the method including:

storing the training difference information which is at least one among waveform data of a difference between waveform data of at least one among current consumption, an input voltage, and power consumption in the first operation state and the waveform data in the second operation state, at least one kind of feature amounts extracted from the waveform data of the difference, and at least one kind of difference in feature amounts extracted from the waveform data in the first operation state and the waveform data in the second operation state, in association with each of the monitoring target electrical devices.

11-3. The monitoring method described in 11 or 11-2, the method performed by the computer, the method including:

a third inference step of inferring change in operation states of at least some of the monitoring target electrical devices based on a second monitoring difference group which is different from the first monitoring difference group and includes at least one of at least one kind of feature amount extracted from the waveform data of the difference between the waveform data of the first timing and the waveform data of the second timing in the unit-specific monitoring waveform data, and at least one kind of difference in feature amounts extracted from the waveform data of the first timing, and the waveform data of the second timing, the training difference information.

11-4. The monitoring method described in 11-3:

wherein in the first inference step, change in power states of at least some monitoring target electrical devices among the monitoring target electrical devices between a power-on state and a power-off state is inferred, and wherein in the third inference step, change in a power state between a power-on state and a power-off state or change in power consumption of each of at least some of the monitoring target electrical devices, excluding the monitoring target electrical devices of which the change in the power states is inferred in the first inference step is inferred.

11-5. The monitoring method described in 11-3:

wherein in the first inference step, change in power consumption of each of some of the monitoring target electrical devices is inferred, and wherein in the third inference step, change in a power state between the power-on state and the power-off state or change in power consumption of each of at least some of the monitoring target electrical devices, excluding the monitoring target electrical devices of which the change in the power consumption is inferred in the first inference step is inferred.

11-6. The monitoring method described in any one of 11 to 11-5:

wherein the computer retains management information indicating an operation state of each of the monitoring target electrical devices at a predetermined timing and updates the management information based on the change in the operation states of the monitoring target electrical devices inferred in the first inference step after the predetermined timing in the second inference step.

11-7. The monitoring method described in 11-6 dependent on 11-3:

wherein in the second inference step, the management information is further updated based on the change in the operation states of the monitoring target electrical devices inferred in the third inference step after the predetermined timing.

11-8. The monitoring method described in any one of 11-2 and 11-3 to 11-7 dependent on 11-2:

wherein the computer stores at least one of device-specific training waveform data which is waveform data of at least one among the current consumption, the input voltage, and the power consumption, and a training feature amount in a predetermined operation state extracted from the device-specific training waveform data, in association with each of the monitoring target electrical devices, and wherein in the second inference step, the operation states of at least some of the monitoring target electrical devices inferred in the first inference step as having no change in the operation states is inferred based on a feature amount extracted from the unit-specific monitoring waveform data and the training feature amount extracted from the device-specific training waveform data.

11-9. The monitoring method described in any one of 11 to 11-8, the method performed by the computer, the method including:

an output step of outputting an inference result.

12. A monitoring system including:

the monitoring device according to any one of 1 to 9; and a repeating device that acquires unit-specific monitoring waveform data which is waveform data of at least one among total current consumption, a total input voltage, and total power consumption measured by a measuring instrument installed in a unit in which monitoring target electrical devices are installed and transmits the unit-specific monitoring waveform data to the monitoring device.

This application claims priority from Japanese Patent Application No. 2014-071122 filed on Mar. 31, 2014, the content of which is incorporated herein by reference in its entirety.

The invention claimed is:

1. A monitoring device comprising:
a unit-specific waveform data acquisition unit, implemented by a processor, that acquires unit-specific monitoring waveform data which is waveform data of at least one among total current consumption, a total input voltage, and total power consumption in a unit in which monitoring target electrical devices are installed;
a first inference unit, implemented by the processor, that infers change in operation states of at least some of the monitoring target electrical devices based on a first monitoring difference group including at least one of at least one kind of feature amount extracted from waveform data of a difference between waveform data of a first timing and waveform data of a second timing in the unit-specific monitoring waveform data, and at least one kind of difference in feature amounts extracted from the waveform data of the first timing and the waveform data of the second timing, and training difference information regarding a difference between a first operation state and a second operation state of each of the monitoring target electrical devices; and
a second inference unit, implemented by the processor, that infers an operation state of each of the monitoring target electrical devices based on an inference result of the first inference unit.

2. The monitoring device according to claim 1, further comprising:
a storage unit that stores the training difference information which is at least one among
waveform data of a difference between waveform data of at least one among current consumption, an input voltage, and power consumption in the first operation state and the waveform data in the second operation state,
at least one kind of feature amount extracted from the waveform data of the difference, and
at least one kind of difference in feature amounts extracted from the waveform data in the first operation state and the waveform data in the second operation state,
in association with each of the monitoring target electrical devices.

3. The monitoring device according to claim 2,
wherein the storage unit stores at least one of device-specific training waveform data which is waveform data of at least one among the current consumption, the input voltage, and the power consumption, and a training feature amount in a predetermined operation state extracted from the device-specific training waveform data, in association with each of the monitoring target electrical devices, and
wherein the second inference unit infers the operation states of at least some of the monitoring target electrical devices inferred as having no change in the operation states by the first inference unit based on a feature amount extracted from the unit-specific monitoring waveform data, and the training feature amount extracted from the device-specific training waveform data.

4. The monitoring device according to claim 1, further comprising:
a third inference unit, implemented by the processor, that infers change in operation states of at least some of the monitoring target electrical devices based on a second monitoring difference group which is different from the first monitoring difference group and includes at least one of at least one kind of feature amount extracted from the waveform data of the difference between the waveform data of the first timing and the waveform data of the second timing in the unit-specific monitoring waveform data, and at least one kind of difference in feature amounts extracted from the waveform data of the first timing and the waveform data of the second timing, and the training difference information.

5. The monitoring device according to claim 4,
wherein the first inference unit infers change in power states of at least some monitoring target electrical devices among the monitoring target electrical devices between a power-on state and a power-off state, and
wherein the third inference unit infers change in a power state between the power-on state and the power-off state or change in power consumption of each of at least some of the monitoring target electrical devices, excluding the monitoring target electrical devices of which the change in the power states is inferred by the first inference unit.

6. The monitoring device according to claim 4,
wherein the first inference unit infers change in power consumption of each of some of the monitoring target electrical devices, and
wherein the third inference unit infers change in a power state between the power-on state and the power-off state or change in power consumption of each of at least some of the monitoring target electrical devices, excluding the monitoring target electrical devices of which the change in the power consumption is inferred by the first inference unit.

7. The monitoring device according to claim 4,
wherein the second inference unit retains management information indicating an operation state of each of the monitoring target electrical devices at a predetermined timing and updates the management information based on the change in the operation states of the monitoring target electrical devices inferred by the first inference unit after the predetermined timing, and
wherein the second inference unit further updates the management information based on the change in the operation states of the monitoring target electrical devices inferred by the third inference unit after the predetermined timing.

8. The monitoring device according to claim 1,
wherein the second inference unit retains management information indicating an operation state of each of the monitoring target electrical devices at a predetermined timing and updates the management information based on the change in the operation states of the monitoring target electrical devices inferred by the first inference unit after the predetermined timing.

9. The monitoring device according to claim 1, further comprising:
an output unit that outputs an inference result.

10. A non-transitory storage medium storing a program causing a computer to function as:
a unit-specific waveform data acquisition unit, implemented by a processor, that acquires unit-specific monitoring waveform data which is waveform data of at least one among total current consumption, a total input voltage, and total power consumption in a unit in which monitoring target electrical devices are installed;
a first inference unit, implemented by the processor, that infers change in operation states of at least some of the monitoring target electrical devices based on a first monitoring difference group including at least one among at least one kind of feature amount extracted from waveform data of a difference between waveform data of a first timing and waveform data of a second timing in the unit-specific monitoring waveform data, and at least one kind of difference in feature amounts extracted from the waveform data of the first timing and the waveform data of the second timing, and training difference information regarding a difference between a first operation state and a second operation state of each of the monitoring target electrical devices; and a second inference unit, implemented by the processor, that infers an operation state of each of the monitoring target electrical devices based on an inference result of the first inference unit.

11. A monitoring method performed by a computer, the method comprising:

a unit-specific waveform data acquisition step of acquiring unit-specific monitoring waveform data which is waveform data of at least one among total current consumption, a total input voltage, and total power consumption in a unit in which monitoring target electrical devices are installed;

a first inference step of inferring change in operation states of at least some of the monitoring target electrical devices based on a first monitoring difference group including at least one among at least one kind of feature amount extracted from waveform data of a difference between waveform data of a first timing and waveform data of a second timing in the unit-specific monitoring waveform data, and at least one kind of difference in feature amounts extracted from the waveform data of the first timing and the waveform data of the second timing, and training difference information regarding a difference between a first operation state and a second operation state of each of the monitoring target electrical devices; and a second inference step of inferring an operation state of each of the monitoring target electrical devices based on an inference result of the first inference step.

12. A monitoring system, comprising:

a repeating device that acquires unit-specific monitoring waveform data which is waveform data of at least one among total current consumption, a total input voltage, and total power consumption measured by a measuring instrument installed in a unit in which monitoring target electrical devices are installed and transmits the unit-specific monitoring waveform data to a monitoring device; and the monitoring device, including:

a unit-specific waveform data acquisition unit, implemented by a processor, that acquires the unit-specific monitoring waveform data;

a first inference unit, implemented by the processor, that infers change in operation states of at least some of the monitoring target electrical devices based on a first monitoring difference group including at least one of at least one kind of feature amount extracted from waveform data of a difference between waveform data of a first timing and waveform data of a second timing in the unit-specific monitoring waveform data, and at least one kind of difference in feature amounts extracted from the waveform data of the first timing and the waveform data of the second timing, and training difference information regarding a difference between a first operation state and a second operation state of each of the monitoring target electrical devices; and a second inference unit, implemented by the processor, that infers an operation state of each of the monitoring target electrical devices based on an inference result of the first inference unit.

13. A monitoring device, comprising:

a memory storing instructions;

a processor configured to execute the instructions to cause the monitoring device to:

acquire unit-specific monitoring waveform data which is waveform data of at least one among total current consumption, a total input voltage, and total power consumption in a unit in which monitoring target electrical devices are installed;

infer change in operation states of at least some of the monitoring target electrical devices based on a first monitoring difference group including at least one of at least one kind of feature amount extracted from waveform data of a difference between waveform data of a first timing and waveform data of a second timing in the unit-specific monitoring waveform data, and at least one kind of difference in feature amounts extracted from the waveform data of the first timing and the waveform data of the second timing, and training difference information regarding a difference between a first operation state and a second operation state of each of the monitoring target electrical devices; and infer an operation state of each of the monitoring target electrical devices based on an inference result of the inferring change in operation states of at least some of the monitoring target electrical devices.

* * * * *